(12) United States Patent
Lee et al.

(10) Patent No.: US 9,362,303 B2
(45) Date of Patent: Jun. 7, 2016

(54) SEMICONDUCTOR MEMORY DEVICES INCLUDING FINE PATTERNS AND METHODS OF FABRICATING THE SAME

(71) Applicants: Jaegoo Lee, Suwon-si (KR); Youngwoo Park, Seoul (KR); Jaeduk Lee, Seongnam-si (KR)

(72) Inventors: Jaegoo Lee, Suwon-si (KR); Youngwoo Park, Seoul (KR); Jaeduk Lee, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/681,505

(22) Filed: Apr. 8, 2015

(65) Prior Publication Data

US 2015/0294980 A1    Oct. 15, 2015

(30) Foreign Application Priority Data

Apr. 9, 2014  (KR) .................. 10-2014-0042418

(51) Int. Cl.
| | |
|---|---|
| *H01L 29/792* | (2006.01) |
| *H01L 27/115* | (2006.01) |
| *H01L 29/66* | (2006.01) |
| *H01L 21/28* | (2006.01) |
| *H01L 21/768* | (2006.01) |
| *H01L 21/285* | (2006.01) |

(52) U.S. Cl.
CPC .... *H01L 27/11582* (2013.01); *H01L 21/28282* (2013.01); *H01L 21/28518* (2013.01); *H01L 21/76877* (2013.01); *H01L 29/66833* (2013.01); *H01L 29/7926* (2013.01)

(58) Field of Classification Search
CPC .................. H01L 27/11578; H01L 27/11568; H01L 21/28282; H01L 21/28518; H01L 21/76877; H01L 29/42364; H01L 29/7926

USPC ......................................................... 257/324
See application file for complete search history.

(56) References Cited

U.S. PATENT DOCUMENTS

| | | | |
|---|---|---|---|
| 8,581,330 B2 | 11/2013 | Kiyotoshi | |
| 8,643,084 B2 | 2/2014 | Shin et al. | |
| 2011/0298013 A1* | 12/2011 | Hwang | ............. H01L 27/11551 257/208 |
| 2012/0012920 A1* | 1/2012 | Shin | .................. H01L 27/11578 257/324 |
| 2012/0146122 A1 | 6/2012 | Whang et al. | |
| 2013/0148398 A1 | 6/2013 | Baek et al. | |
| 2013/0161726 A1 | 6/2013 | Kim et al. | |
| 2013/0248965 A1* | 9/2013 | Nakai | ................... H01L 29/788 257/315 |
| 2014/0061776 A1* | 3/2014 | Kwon | ................. H01L 21/8239 257/329 |

FOREIGN PATENT DOCUMENTS

| | | |
|---|---|---|
| JP | 2013-038124 | 2/2013 |
| KR | 10-2012-0007838 A | 1/2012 |
| KR | 10-2013-0072911 | 2/2013 |

\* cited by examiner

*Primary Examiner* — Tu-Tu Ho
(74) *Attorney, Agent, or Firm* — Myers Bigel & Sibley

(57) ABSTRACT

Semiconductor devices are provided including an active pillar protruding from a substrate; a first gate electrode and a second gate electrode adjacent to a sidewall of the active pillar and vertically overlapping with each other, the first and second gate electrodes being insulated from each other; a first intergate insulating layer covering a first surface of the first gate electrode; and a second intergate insulating layer covering a second surface, opposite the first surface, of the second gate electrode and spaced apart from the first intergate insulating layer. The first intergate insulating layer and the second intergate insulating layer define an air gap therebetween.

18 Claims, 27 Drawing Sheets

SEMICONDUCTOR MEMORY DEVICES INCLUDING FINE PATTERNS AND METHODS OF FABRICATING THE SAME

CROSS-REFERENCE TO RELATED APPLICATION

This U.S. non-provisional patent application claims priority under 35 U.S.C. §119 to Korean Patent Application No. 10-2014-0042418, filed on Apr. 9, 2014, in the Korean Intellectual Property Office, the disclosure of which is hereby incorporated herein by reference in its entirety.

FIELD

The inventive concept relate to semiconductor memory devices and methods of fabricating the same.

BACKGROUND

A three-dimensional integrated circuit (3D-IC) memory technique has been developed to increase memory capacity of a semiconductor memory device. The 3D-IC memory technique includes a variety of methods for arranging memory cells three-dimensionally. In addition to the 3D-IC memory technique, a patterning technique for fine patterns and a multi-level cell (MLC) technique may be used to increase the memory capacity of the semiconductor memory device. However, the patterning technique for the fine patterns may be very expensive, and the MLC technique may not be suitable for increasing the number of bits per unit cell. Thus, the 3D-IC memory technique may be important to increasing the memory capacity. In addition, if the patterning technique for the fine patterns and the MLC technique are combined with the 3D-IC memory technique, the memory capacity may further increase. Thus, the patterning technique for the fine patterns and the MLC technique may be developed independently of the 3D-IC memory technique.

SUMMARY

Some embodiments of the inventive concept provide semiconductor memory devices capable of reducing a coupling effect between gate electrodes adjacent to each other.

Further embodiments of the inventive concept provide methods of fabricating the semiconductor memory devices.

Still further embodiments provide a semiconductor memory device including an active pillar protruding from a substrate; a first gate electrode and a second gate electrode adjacent to a sidewall of the active pillar and vertically overlapping with each other, the first and second gate electrodes being insulated from each other; a first intergate insulating layer covering a first surface of the first gate electrode; and a second intergate insulating layer covering a second surface, opposite the first surface, of the second gate electrode and spaced apart from the first intergate insulating layer. The first intergate insulating layer and the second intergate insulating layer define an air gap therebetween.

In some embodiments, the semiconductor memory device may further include a first charge trap layer between the active pillar and the first gate electrode; and a second charge trap layer between the active pillar and the second gate electrode. The second charge trap layer may be spaced apart from the first charge trap layer.

In further embodiments, the air gap region may be between the first charge trap layer and the second charge trap layer.

In still further embodiments, the semiconductor memory device may further include a first blocking dielectric layer between the first charge trap layer and the first gate electrode; and a second blocking dielectric layer between the second charge trap layer and the second gate electrode. The second blocking dielectric layer may be spaced apart from the first blocking dielectric layer.

In some embodiments, the first blocking dielectric layer and the first charge trap layer may be between the first intergate insulating layer and the active pillar, and the second blocking dielectric layer and the second charge trap layer may be between the second intergate insulating layer and the active pillar.

In further embodiments, the semiconductor memory device may further include a first high-k dielectric layer between the first blocking dielectric layer and the first gate electrode; and a second high-k dielectric layer between the second blocking dielectric layer and the second gate electrode. The second high-k dielectric layer may be spaced apart from the first high-k dielectric layer.

In still further embodiments, the first high-k dielectric layer may be between the first gate electrode and the first intergate insulating layer, and the second high-k dielectric layer may be between the second gate electrode and the second intergate insulating layer.

Some embodiments of the present inventive concept provide semiconductor memory devices including an active pillar protruding from a substrate; a first gate electrode and a second gate electrode adjacent to a sidewall of the active pillar and vertically overlapping with each other, the first and second gate electrodes being insulated from each other; a first charge trap layer between the active pillar and the first gate electrode; and a second charge trap layer between the active pillar and the second gate electrode, the second charge trap layer being spaced apart from the first charge trap layer.

Further embodiments of the present inventive concept provide methods of fabricating a semiconductor memory device. The methods may include sequentially forming mold layers on a substrate, each of the mold layers comprising a first sacrificial layer, a first intergate insulating layer, a second sacrificial layer, and a second intergate insulating layer which are sequentially stacked; patterning the second intergate insulating layers, the second sacrificial layers, the first intergate insulating layers, and the first sacrificial layers to define an active hole exposing at least a portion of the substrate; forming a blocking dielectric layer, a charge trap layer, a tunnel dielectric layer, and an active pillar which sequentially cover a sidewall of the active hole; patterning the second intergate insulating layers, the second sacrificial layers, the first intergate insulating layers, and the first sacrificial layers to form a groove exposing the substrate, the groove spaced apart from the active hole; replacing the first sacrificial layers with conductive layers through the groove; and removing the second sacrificial layers to define air gap regions.

In still further embodiments, the method may further include replacing portions of the second sacrificial layers exposed by the active hole with etch stop patterns before forming the blocking dielectric layer.

In some embodiments, replacing the portions of the second sacrificial layers exposed by the active hole with the etch stop patterns may include removing the portions of the second sacrificial layers exposed by the active hole; and forming the etch stop patterns in regions that are formed by removing the portions of the second sacrificial layers.

In further embodiments, the method may further include partially removing the blocking dielectric layer and the charge trap layer adjacent to the second sacrificial layers after removing the second sacrificial layers. In these embodiments, the air gap regions may expose the tunnel dielectric layer.

In still further embodiments, the method may further include forming a first high-k dielectric layer covering the sidewall of the active hole before forming the blocking dielectric layer; and partially removing the first high-k dielectric layer adjacent to the second sacrificial layers after removing the second sacrificial layers.

In some embodiments, each of the mold layers may further include second high-k dielectric layers that are formed on first and second opposite surfaces of the first sacrificial layer, respectively. The second high-k dielectric layers are formed before the active hole is formed.

In further embodiments, the method may further include forming a filling insulation layer covering sidewalls of the groove; and forming a conductive interconnection in the groove, the conductive interconnection being in contact with the substrate and a sidewall of the filling insulation layer.

In still further embodiments, the first sacrificial layers may be formed of poly-silicon layers, and replacing the first sacrificial layers with the conductive layers may include performing a silicidation process to convert the first sacrificial layers into metal silicide layers.

In some embodiments, the method may further include partially removing the first sacrificial layers exposed through the groove to partially expose first surfaces of the first intergate insulating layers and surfaces of the second intergate insulating layers before performing the silicidation process.

In further embodiments, replacing the first sacrificial layers with the conductive layers may include removing the first sacrificial layers to form empty regions exposing bottom surfaces of the first intergate insulating layers, surfaces of the second intergate insulating layers, and the blocking dielectric layer; conformally forming a high-k dielectric layer in the empty regions; forming a conductive layer filling the empty regions; and removing the conductive layer disposed in the groove.

BRIEF DESCRIPTION OF THE DRAWINGS

Embodiments of the inventive concept will become more apparent in view of the attached drawings and accompanying detailed description.

DETAILED DESCRIPTION OF THE EMBODIMENTS

Figure 1:
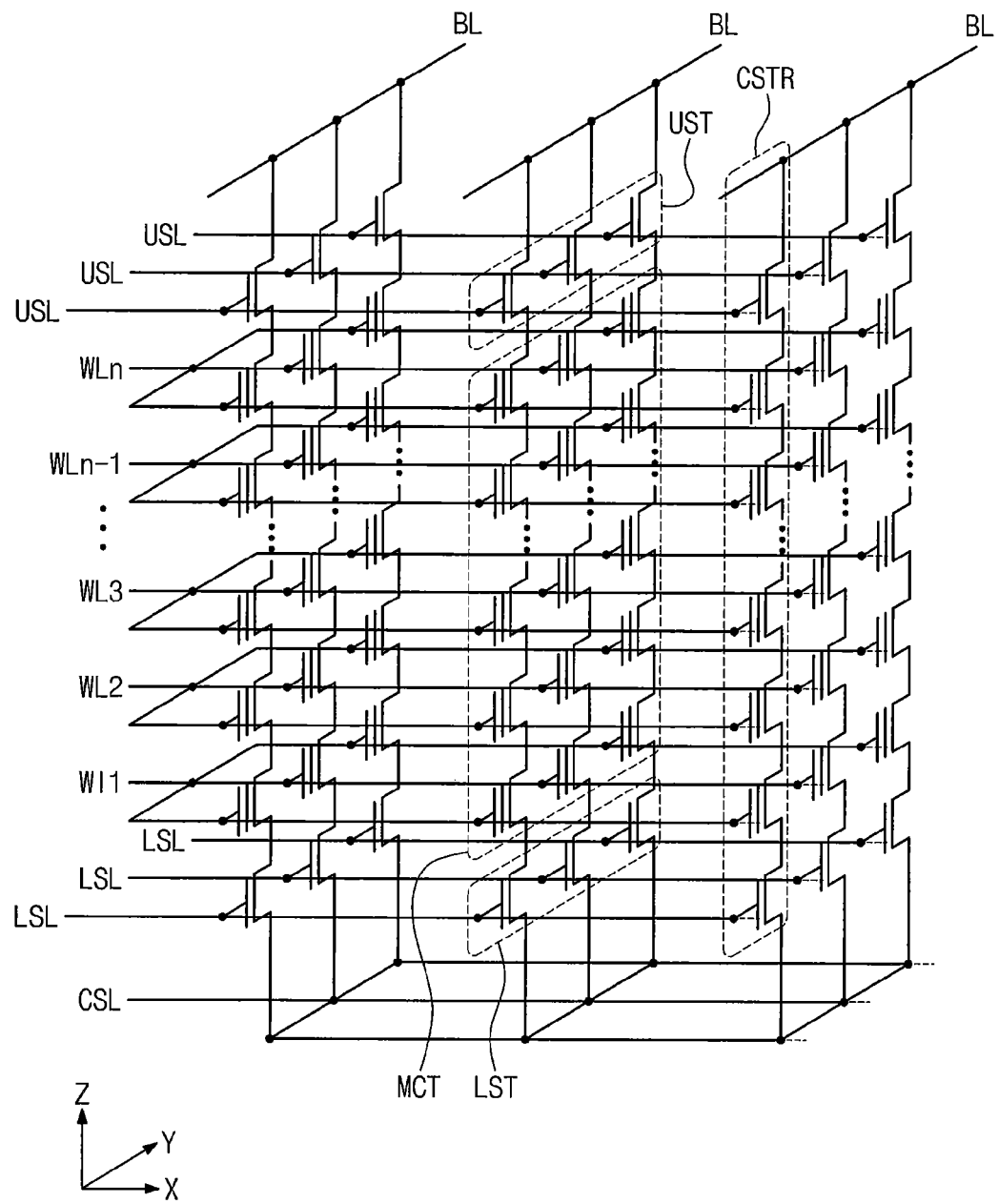
FIG. 1 is a circuit diagram of a semiconductor memory device according to some embodiments of the inventive concept.

The inventive concept will now be described more fully hereinafter with reference to the accompanying drawings, in which exemplary embodiments of the inventive concept are shown. The advantages and features of the inventive concept and methods of achieving them will be apparent from the following example embodiments that will be described in more detail with reference to the accompanying drawings. It should be noted, however, that the inventive concept are not limited to the following example embodiments, and may be implemented in various forms. Accordingly, the example embodiments are provided only to disclose the inventive concept and let those skilled in the art know the category of the inventive concept. In the drawings, embodiments of the inventive concept are not limited to the specific examples provided herein and are exaggerated for clarity.

The terminology used herein is for the purpose of describing particular embodiments only and is not intended to limit the inventive concept. As used herein, the singular terms "a," "an" and "the" are intended to include the plural forms as well, unless the context clearly indicates otherwise. As used herein, the term "and/or" includes any and all combinations of one or more of the associated listed items.

It will be understood that when an element is referred to as being "connected" or "coupled" to another element, it may be directly connected or coupled to the other element or intervening elements may be present. Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, embodiments in the detailed description will be described with sectional views as ideal exemplary views of the inventive concept. Accordingly, shapes of the exemplary views may be modified according to manufacturing techniques and/or allowable errors. Therefore, the embodiments of the inventive concept are not limited to the specific shape illustrated in the exemplary views, but may include other shapes that may be created according to manufacturing processes. Areas exemplified in the drawings have general properties, and are used to illustrate specific shapes of elements. Thus, this should not be construed as limiting the scope of the inventive concept.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present inventive concept. Exemplary embodiments of aspects of the present inventive concept explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-section(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-section(s) illustrated herein provide support for a plurality of devices according to various embodiments described herein that extend along two different directions in a plan view and/or in three different directions in a perspective view. For example, when a single active region is illustrated in a cross-section of a device/structure, the device/structure may include a plurality of active regions and transistor structures (or memory cell structures, gate structures, etc., as appropriate to the case) thereon, as would be illustrated by a plan view of the device/structure.

Hereinafter, embodiments of the inventive concept will be described in detail with reference to the drawings. Semiconductor memory devices according to embodiments of the inventive concept have a structure of a three-dimensional (3D) semiconductor memory device.

Figure 2:
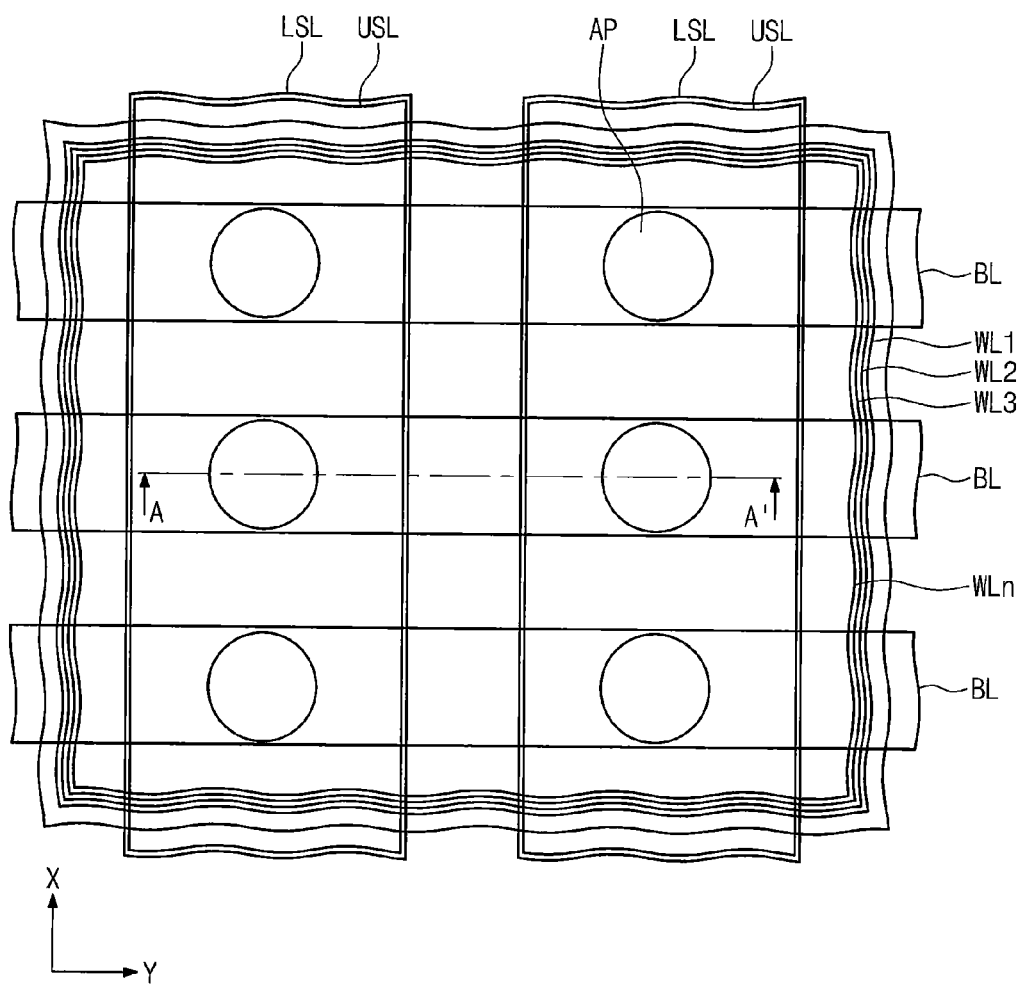
FIG. 2 is a plan view illustrating a semiconductor memory device according to some embodiments of the inventive concept.
Figure 3:
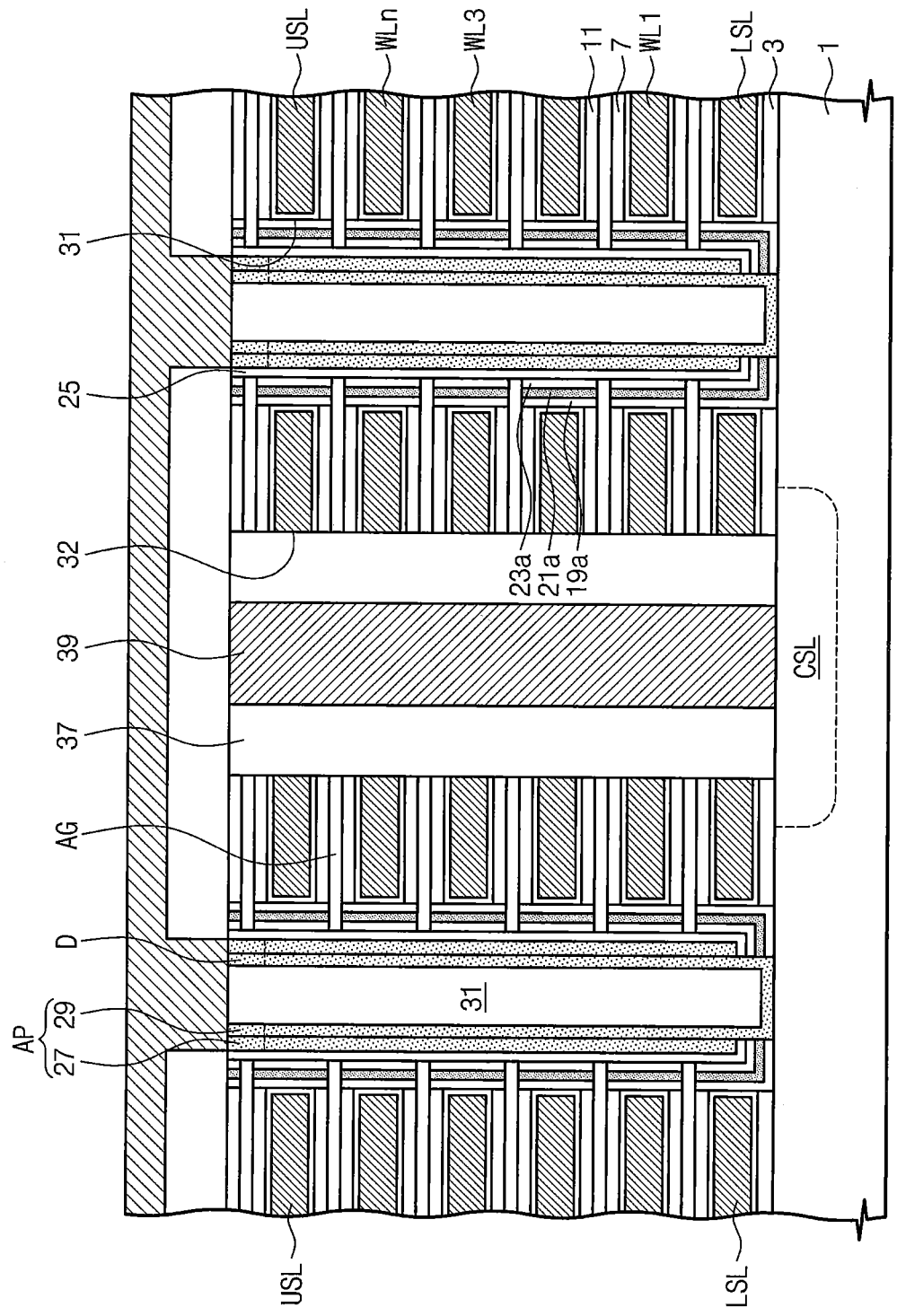
FIG. 3 is a cross-section taken along a line A-A' of FIG. 2 illustrating a semiconductor memory device according to some embodiments of the inventive concept.

FIG. 1 is a circuit diagram of a semiconductor memory device according to example embodiments of the inventive concept. FIG. 2 is a plan view illustrating a semiconductor memory device according to example embodiments of the inventive concept. FIG. 3 is a cross-section taken along a line A-A' of FIG. 2 to illustrate a semiconductor memory device according to some embodiments of the inventive concept.

Referring now to FIGS. 1 to 3, a vertical semiconductor memory device according to some embodiments may include a common source line CSL, a plurality of bit lines BL, and a plurality of cell strings CSTR disposed between the common source line CSL and the bit lines BL.

The common source line CSL may be a dopant injection region existing in a substrate 1. The substrate 1 may be a semiconductor substrate or may include the semiconductor substrate and an epitaxial semiconductor layer formed on the semiconductor substrate. The bit lines BL may be conductive lines that are spaced apart from the substrate 1 and disposed over the substrate 1. The bit lines BL may be two-dimensionally arranged and a plurality of cell strings CSTR may be connected in parallel to each of the bit lines BL. Thus, the cell strings CSTR may be two-dimensionally arranged on the substrate 1.

Each of the cell strings CSTR may include a lower selection transistor LST connected to the common source line CSL, an upper selection transistor UST connected to the bit line BL, and a plurality of memory cell transistors MCT disposed between the lower and upper selection transistors LST and UST. The lower selection transistor LST, the memory cell transistors MCT, and the upper selection transistor UST may be connected in series to one another. A lower selection line LSL, a plurality of word lines WL1 to WLn, and an upper selection line USL which are disposed between the common source line CSL and the bit line BL may be used as gate electrodes of the lower selection transistor LST, the memory cell transistors MCT, and the upper selection transistor UST, respectively. The common source line CSL, the lower selection line LSL, the word lines WL1 to WLn, and the upper selection line USL may extend in a first direction X. The bit lines BL may extend in a second direction Y intersecting the first direction X.

Distances of the lower selection transistors LST from the substrate 1 may be substantially equal to one another. Gate electrodes of the lower selection transistors LST may be at an equipotential state because they are connected in common to the lower selection line LSL. Likewise, gate electrodes of the memory cell transistors MCT disposed at a substantially same distance from the common source line CSL may be connected in common to one of the word lines WL1 to WLn, so they may be at an equipotential state. Since one cell string CSTR includes the plurality of memory cell transistors MCT respectively disposed at different distances from the common source line CSL, the plurality of word lines WL1 to WLn may be sequentially stacked between the common source line CSL and the bit line BL.

Each of the cell strings CSTR may include an active pillar AP that vertically extends from the substrate 1 so as to be connected to the bit line BL. The active pillar AP may be formed to penetrate the upper selection line USL, the word lines WL1 to WLn, and the lower selection line LSL. The active pillar AP may include a first active layer 27 and a second active layer 29. The first active layer 27 may be a semiconductor layer and may have a spacer shape. The second active layer 29 may have a cup shape. An inner space of the active pillar AP, for example, an inner space of the second active layer 29, may be filled with a first filling insulation pattern 31.

A common drain region D may be disposed in a top end portion of the active pillar AP. The bit line BL may penetrate an upper interlayer insulating layer 41 covering the upper selection line USL and may be electrically connected to the common drain region D.

A buffer oxide layer 3 may be disposed on the substrate 1. Insulating structures may be disposed on a top surface of the upper selection line USL, between the upper selection line USL and the word line WLn, between the word lines WL1 to WLn, and between the word line WL1 and the lower selection line LSL, respectively. In these embodiments, each of the insulating structures includes a first integrate insulating layer 7 and a second intergate insulating layer 11. An air gap region AG is disposed (or defined) between the first intergate insulating layer 7 and the second integrate insulating layer 11 in each of the insulating structures. A dielectric constant of a silicon oxide layer that may be mainly used as the intergate insulating layers 7 and 11 is about 3.9, but a dielectric constant of air in the air gap region AG is about 1. A coupling effect between the lines LSL, WL1 to WLn, and USL used as gate electrodes may be reduced by the air gap region AG, thereby reducing RC delay of the lines LSL, WL1 to WLn, and USL and improving a signal transfer speed of the lines LSL, WL1 to WLn, and USL. In addition, thicknesses of the intergate insulating layers 7 and 11 may be reduced by the low dielectric constant of the air gap region AG, so a highly integrated semiconductor memory device may be easily realized.

The lower selection line LSL, the word lines WL1 to WLn, and the upper selection line USL which are sequentially stacked may constitute a stack structure. The stack structure may be provided in plurality on the substrate 1. The stack structures may be laterally spaced apart from each other. A second filling insulation pattern 37 may be disposed between the stack structures adjacent to each other. A common source interconnection 39 may be disposed in the second filling insulation pattern 37. The common source interconnection 39 may be in contact with the common source line CSL.

A tunnel dielectric layer 25 may be disposed between the active pillar AP and the lines USL, WL1 to WLn, and LSL. A charge trap pattern 23a, a blocking dielectric pattern 21a, and a high-k dielectric pattern 19a may be sequentially disposed between the tunnel dielectric layer 25 and each of the lines USL, WL1 to WLn, and LSL. The high-k dielectric pattern 19a may include a high-k dielectric material of which a dielectric constant is higher than that of a silicon oxide layer. The tunnel dielectric layer 25 may conformally and continuously cover a sidewall and a bottom surface of the first active layer 27. The charge trap patterns 23a may be spaced apart from each other by the air gap region AG. In other words, one charge trap pattern 23a between the active pillar AP and one of the stacked word lines WL1 to WLn may be spaced apart from another charge trap pattern 23a between the active pillar and another, adjacent to the one, of the stacked word lines WL1 to WLn. Thus, it may be possible to reduce the likelihood, or possibly prevent, charges from being transferred between the charge trap patterns 23a vertically adjacent to each other. This means that operating errors of the semiconductor memory device and coupling effect may be reduced.

The lower and upper selection transistors LST and UST and the memory cell transistors MCT may be metal-oxide-semiconductor field effect transistors (MOSFETs) using the active pillar AP as channel regions.

Figure 4:
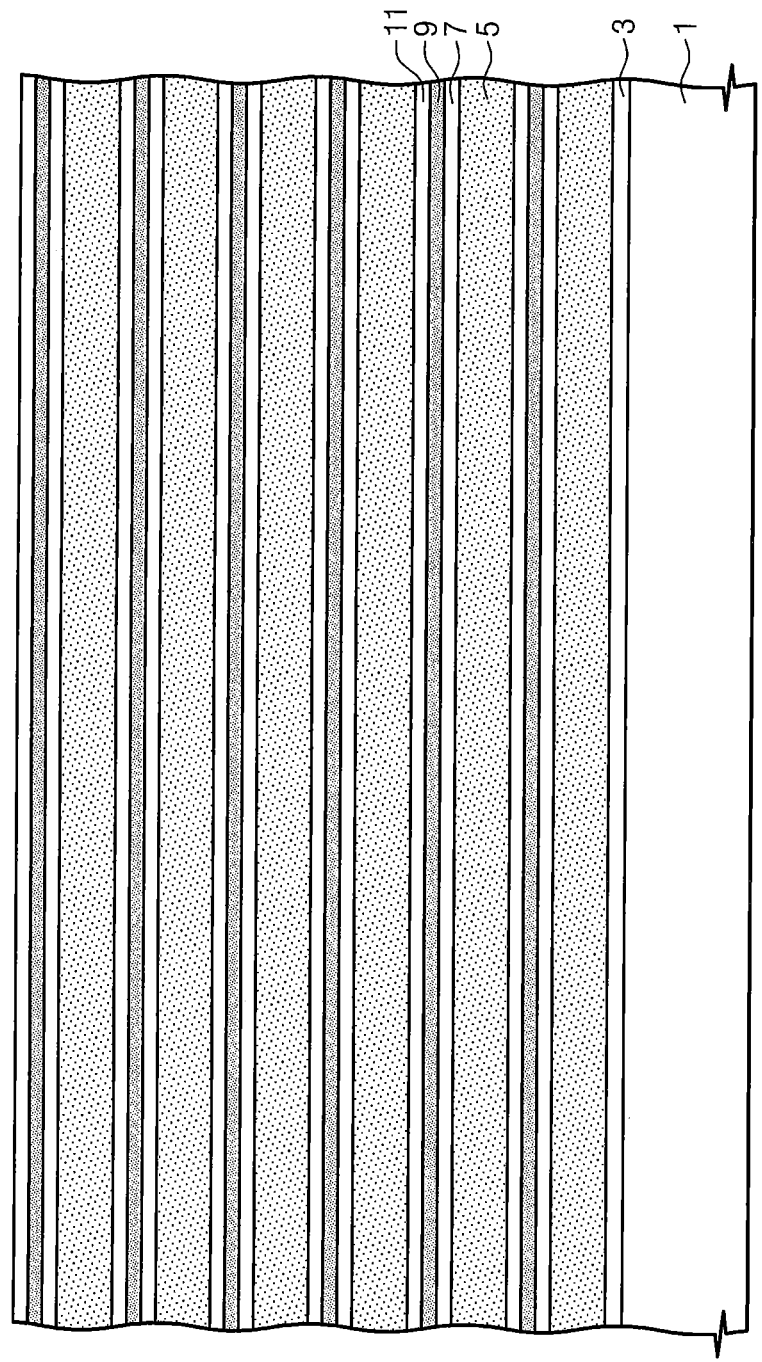
FIGS. 4 to 14 are cross-sections illustrating processing steps in the fabrication of the semiconductor memory device having the cross-section of FIG. 3 in accordance with some embodiments of the present inventive concept.

Referring now to FIGS. 4 to 14, cross-sections illustrating processing steps in the fabrication of a semiconductor memory device having the cross-section of FIG. 3. As illustrated in FIG. 4, a buffer oxide layer 3 may be formed on a substrate 1. Mold layers may be sequentially stacked on the buffer oxide layer 3. Each of the mold layers includes a first sacrificial layer 5, a first intergate insulating layer 7, a second sacrificial layer 9, and a second intergate insulating layer 11 which are sequentially stacked. In other words, the first sacrificial layer 5, the first intergate insulating layer 7, the second sacrificial layer 9, and the second intergate insulating layer 11 are repeatedly stacked on the buffer oxide layer 3. Etch rates of the sacrificial layers 5 and 9 may be different from the intergate insulating layers 7 and 11. For example, the intergate insulating layers 7 and 11 may be formed of silicon oxide layers. The first sacrificial layer 5 and the second sacrificial layer 9 may be formed of different materials from each other. In some embodiments, the first sacrificial layer 5 may be formed of a poly-silicon layer, and the second sacrificial layer 9 may be formed of a silicon nitride layer.

Figure 5:
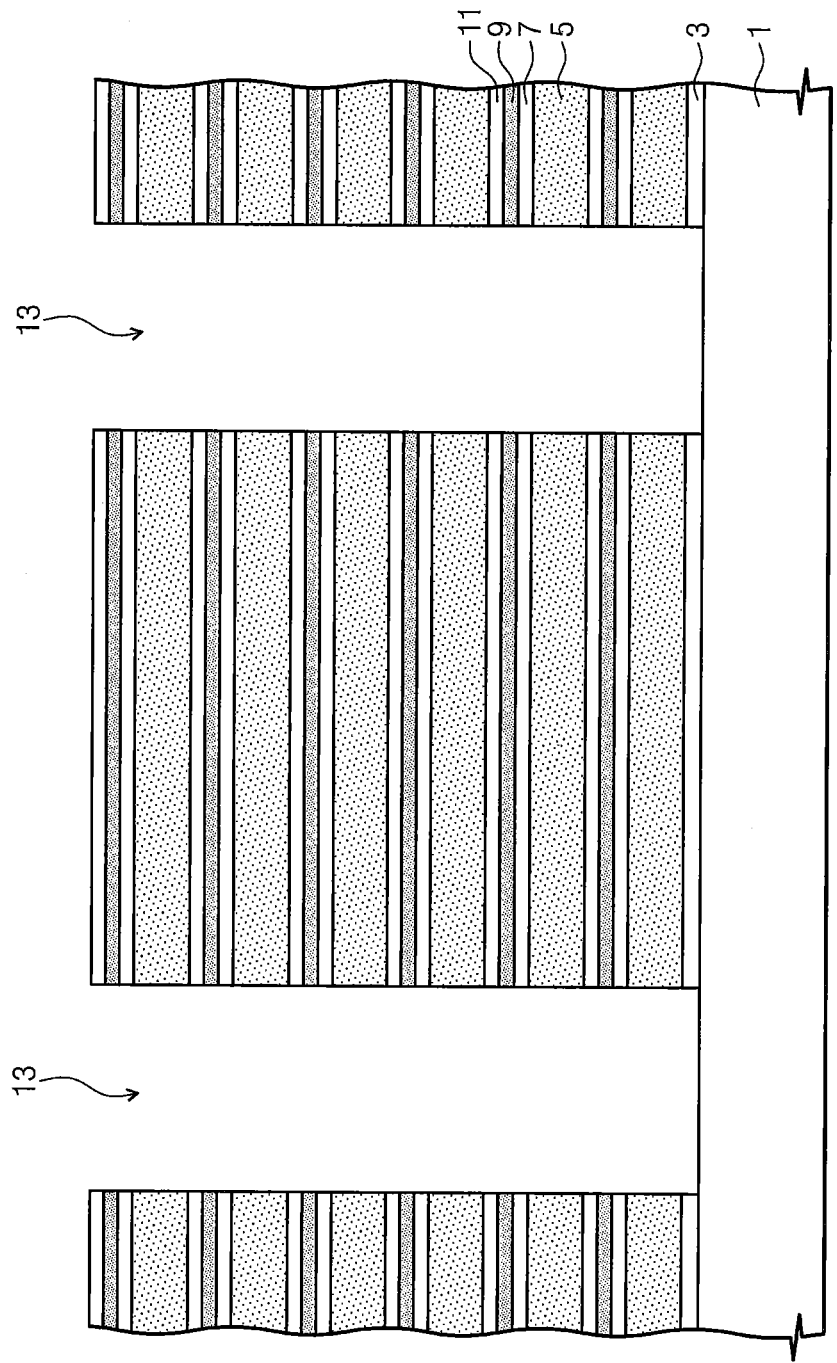

Referring now to FIG. 5, the mold layers, i.e., the second intergate insulating layers 11, the second sacrificial layers 9, the first intergate insulating layers 7, the first sacrificial layers 5, and the buffer oxide layer 3 may be patterned to form active holes 13 exposing the substrate 1.

Figure 6:
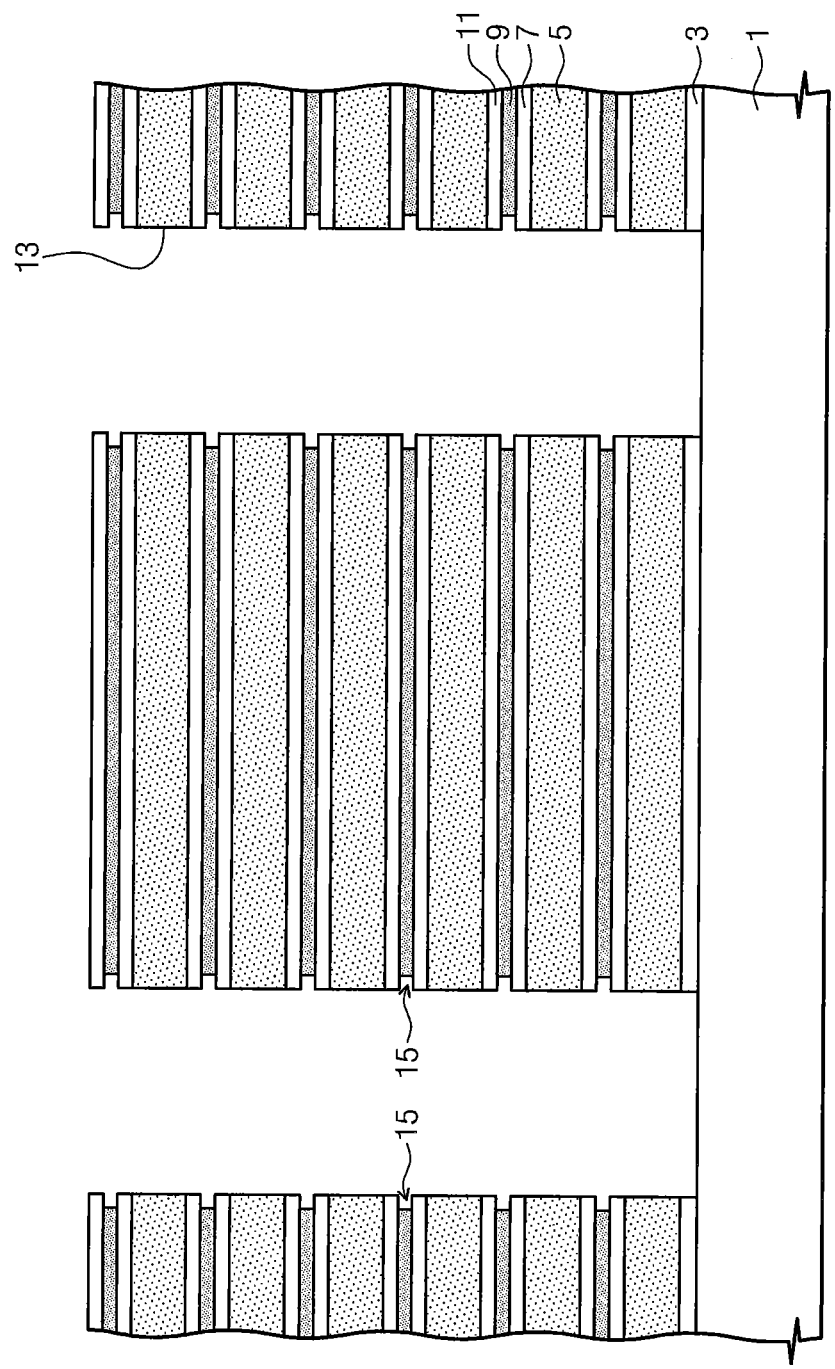

Referring now to FIG. 6, portions, exposed through the active hole 13, of the second sacrificial layers 9 are removed. If the second sacrificial layers 9 are formed of silicon nitride layers, an isotropic etching process using phosphoric acid may be performed. At this time, a process time of the isotropic etching process may be controlled to remove only the portions of the second sacrificial layers 9. Thus, top and bottom surfaces of the first and second intergate insulating layers 7 and 11 may be partially exposed through first regions 15 that are formed by removing the portions of the second sacrificial layers 9.

Figure 7:
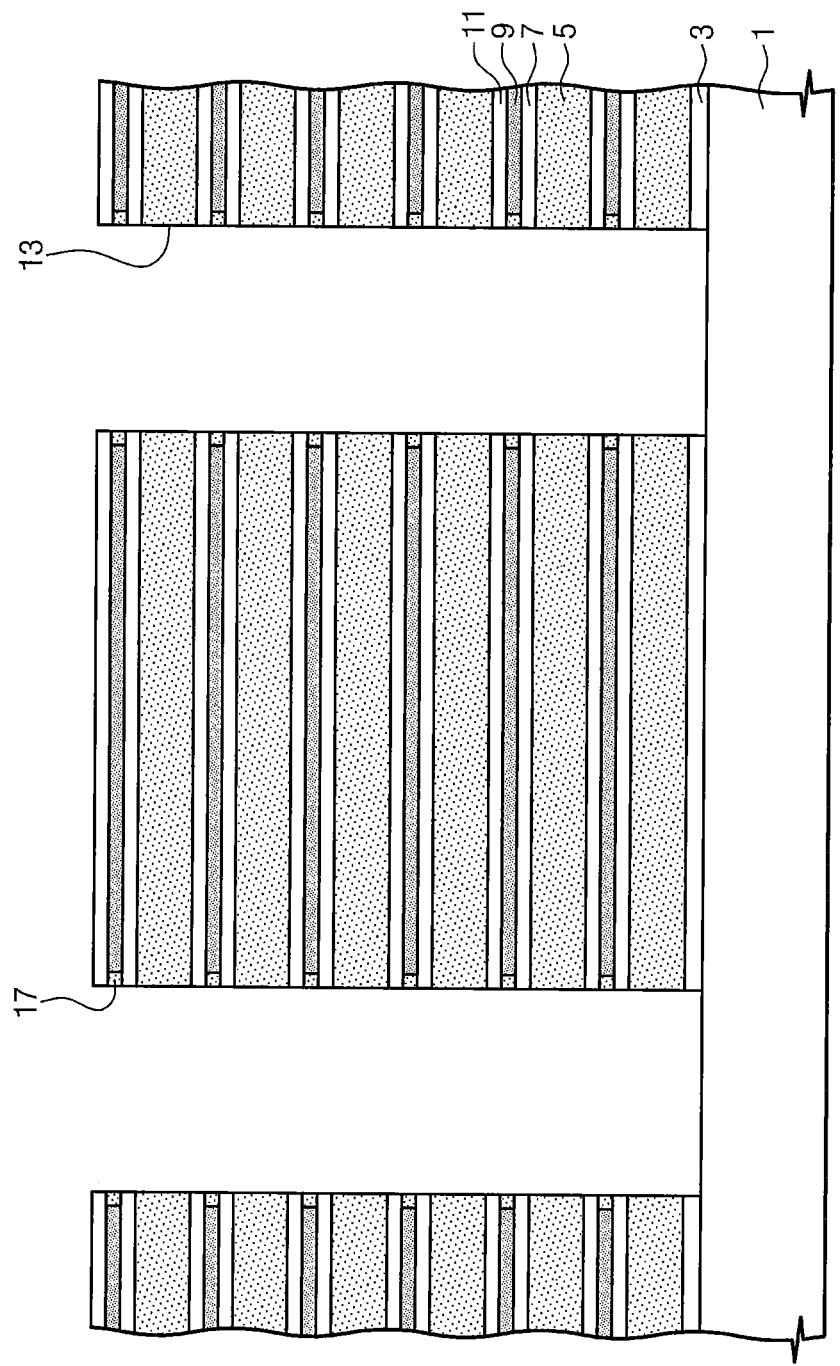

Referring now to FIG. 7, an etch stop layer may be conformally formed on an entire top surface of the substrate 1 to fill the first regions 15. An etching process, for example, an anisotropic etching process, may be performed on the etch stop layer to form etch stop patterns 17 in the first regions 15, respectively. The etch stop pattern 17 may be formed of, for example, the same poly-silicon layer as the first sacrificial layer 5.

Figure 8:
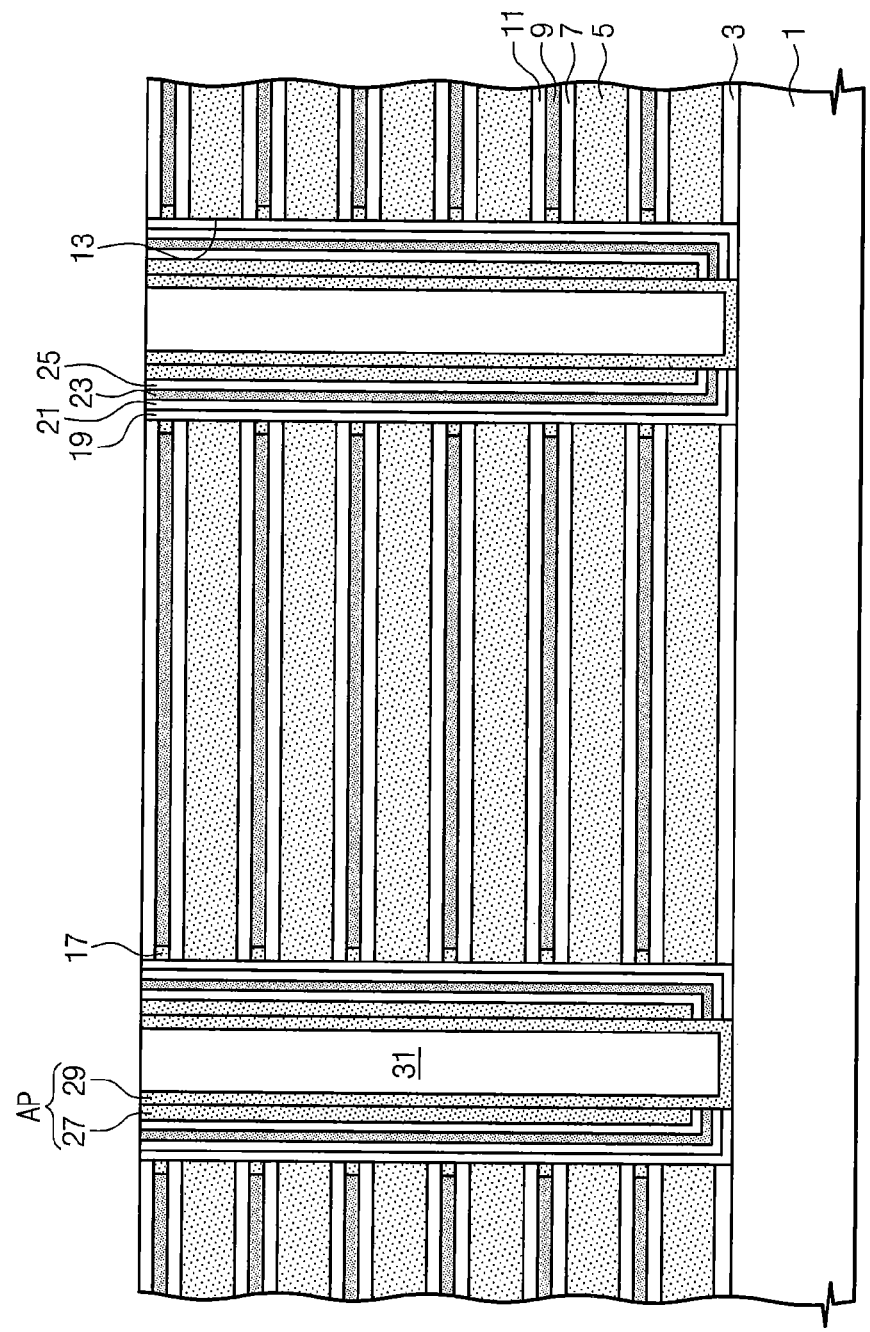

Referring now to FIG. 8, a high-k dielectric layer 19, a blocking dielectric layer 21, a charge trap layer 23, a tunnel dielectric layer 25, and a first active layer 27 may be sequentially and conformally formed on an entire top surface of the substrate having the active holes 13, and the layers 27, 25, 23, 21, and 19 may be anisotropically etched to expose the substrate 1 disposed under the active holes 13. Thereafter, a second active layer 29 may be conformally formed on an entire top surface of the substrate 1, and then a first filling insulation layer may be formed to fill the active holes 13. A planarization process may be performed on the first filling insulation layer and the second active layer 29 to form an active pillar AP and a first filling insulation pattern 31 in each of the active holes 13. The active pillar includes the first active layer 27 and the second active layer 29.

Figure 9:
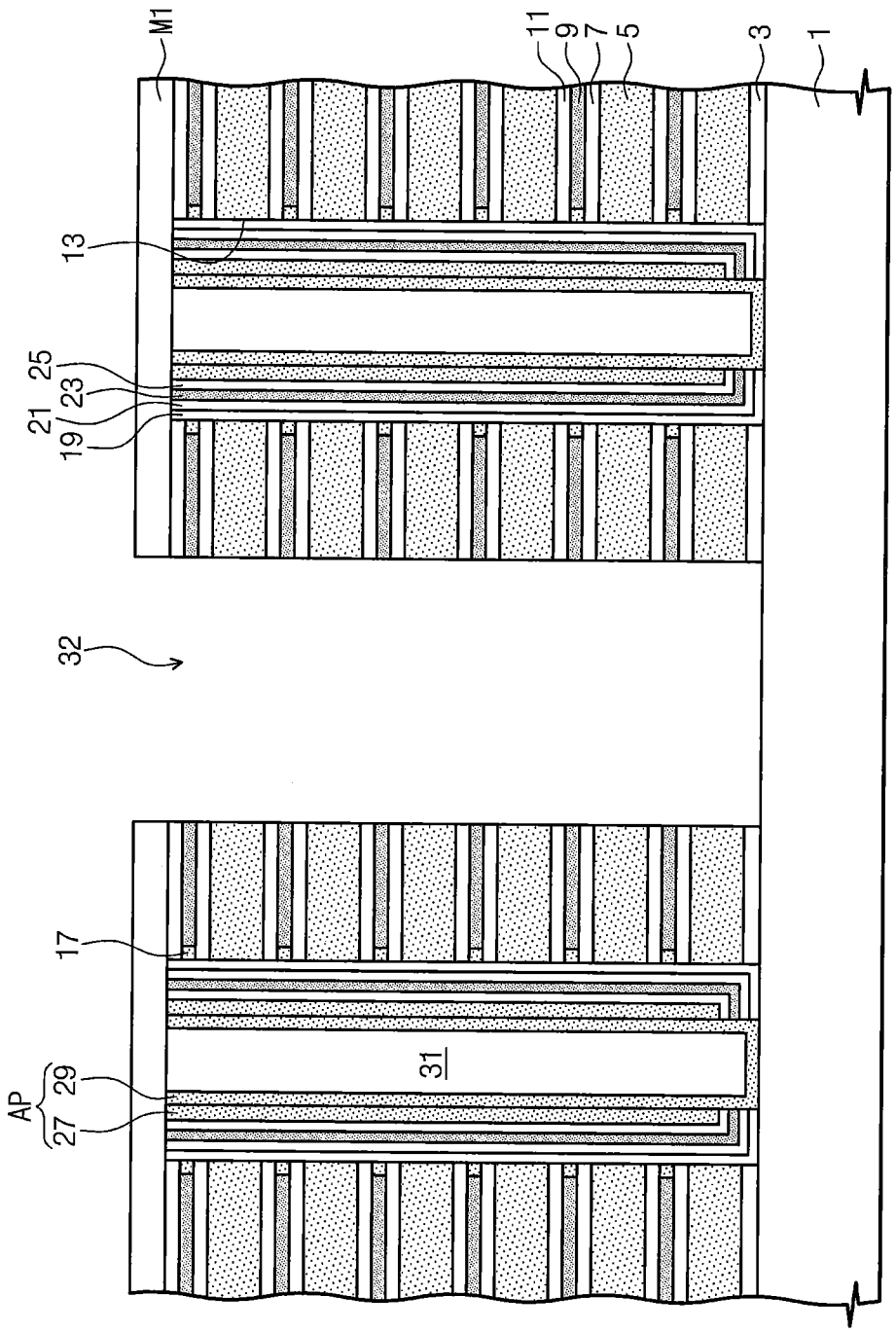

Referring now to FIG. 9, a mask pattern M1 is formed on the substrate 1. The mask pattern M1 has an opening spaced apart from the active holes 13. The mold layers, i.e., the second intergate insulating layers 11, the second sacrificial layers 9, the first intergate insulating layers 7, and the first sacrificial layers 5, and the buffer oxide layer 3 may be patterned using the mask pattern M1 to form a groove 32 exposing the substrate 1.

Figure 10:
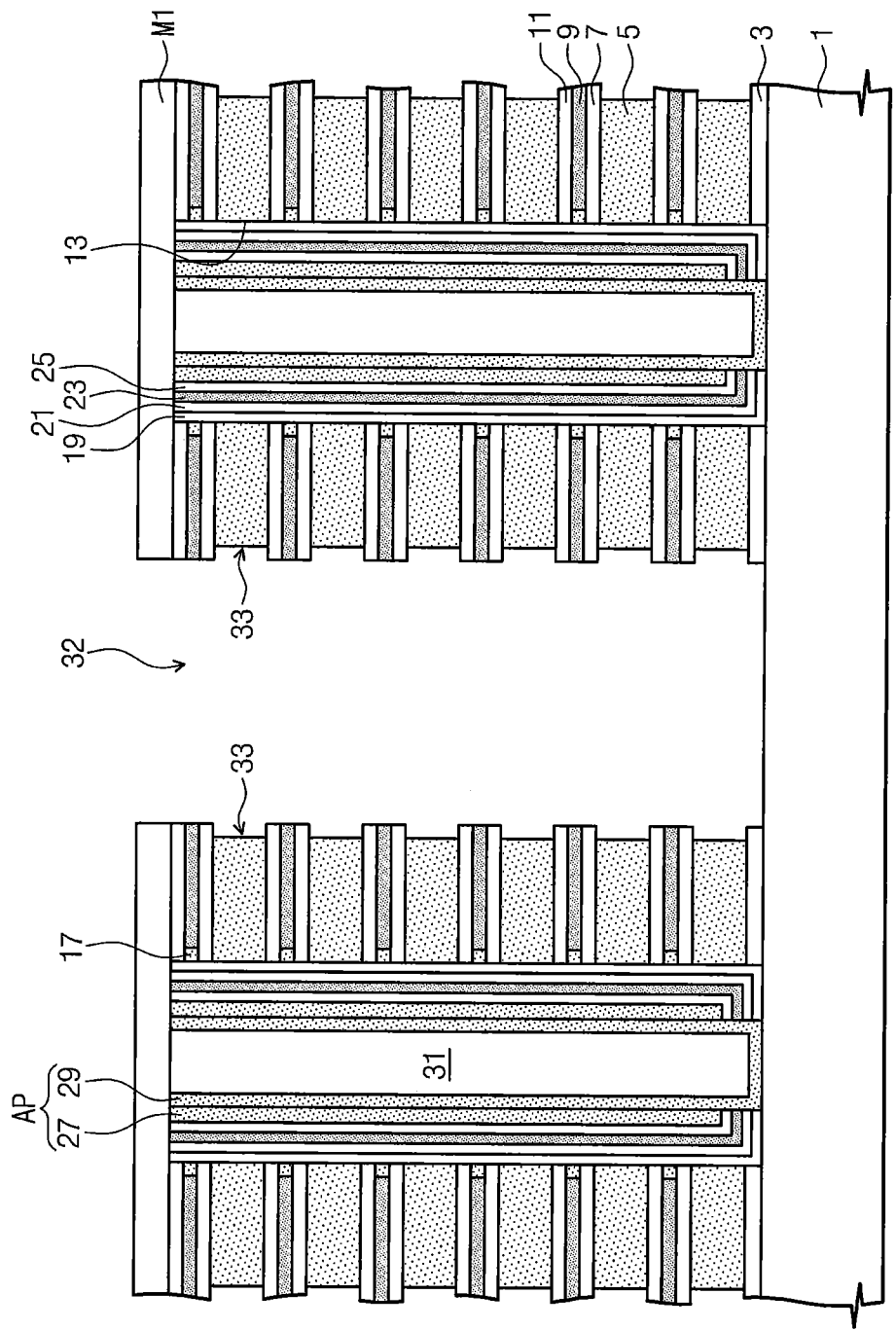

Referring now to FIG. 10, sidewalls, which are exposed by the groove 32, of the first sacrificial layers 5 may be recessed to form second regions 33 in the state that the mask pattern M1 remains. The top and bottom surfaces of the first and second intergate insulating layers 7 and 11 may be partially exposed through the second regions 33.

Figure 11:
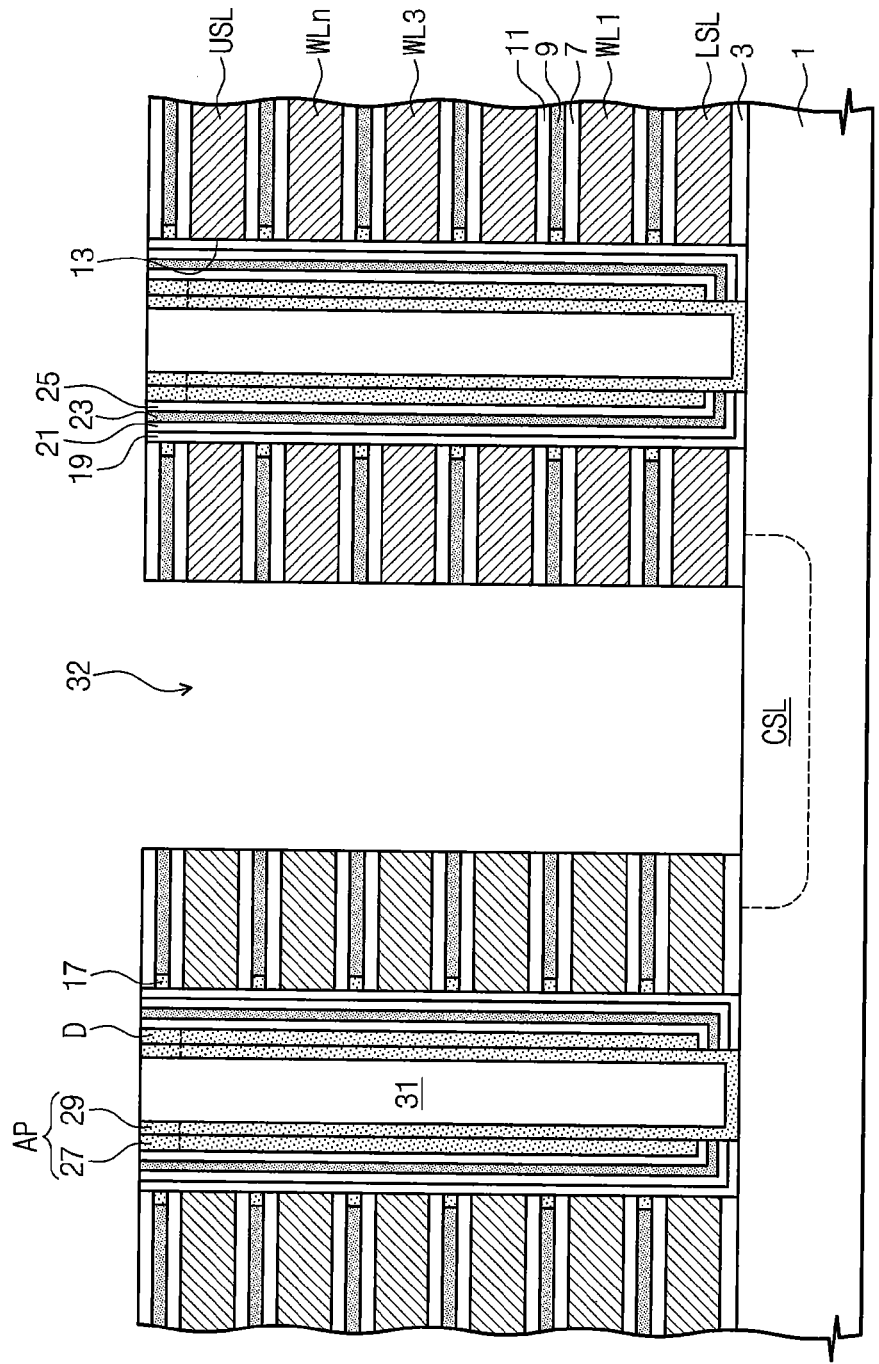

Referring now to FIG. 11, the first sacrificial layers 5 are replaced with conductive layers. In some embodiments, since the first sacrificial layer 5 is formed of the poly-silicon layer, a silicidation process may be performed to convert the first sacrificial layer 5 into a metal silicide layer. For example, the conductive layer may be a nickel silicide layer. A volume of a silicide material may be expanded during the silicidation process. In other words, a volume of the metal silicide layer may be greater than a volume of the poly-silicon layer. The sacrificial layers 9 may be partially removed in advance in the step described with reference to FIG. 10 in due consideration of the volume expansion of the metal silicide layer. As a result, conductive lines LSL, WL1 to WLn, USL consisting of the conductive layers may be formed. An ion implantation process may be performed to form a common source line CSL in the substrate 1 under the groove 32 and a drain region D in a top end portion of the active pillar AP. Since the first sacrificial layers 5 are easily replaced with the conductive layers by the silicidation process, fabricating processes of the semiconductor memory device may be simplified.

Figure 12:
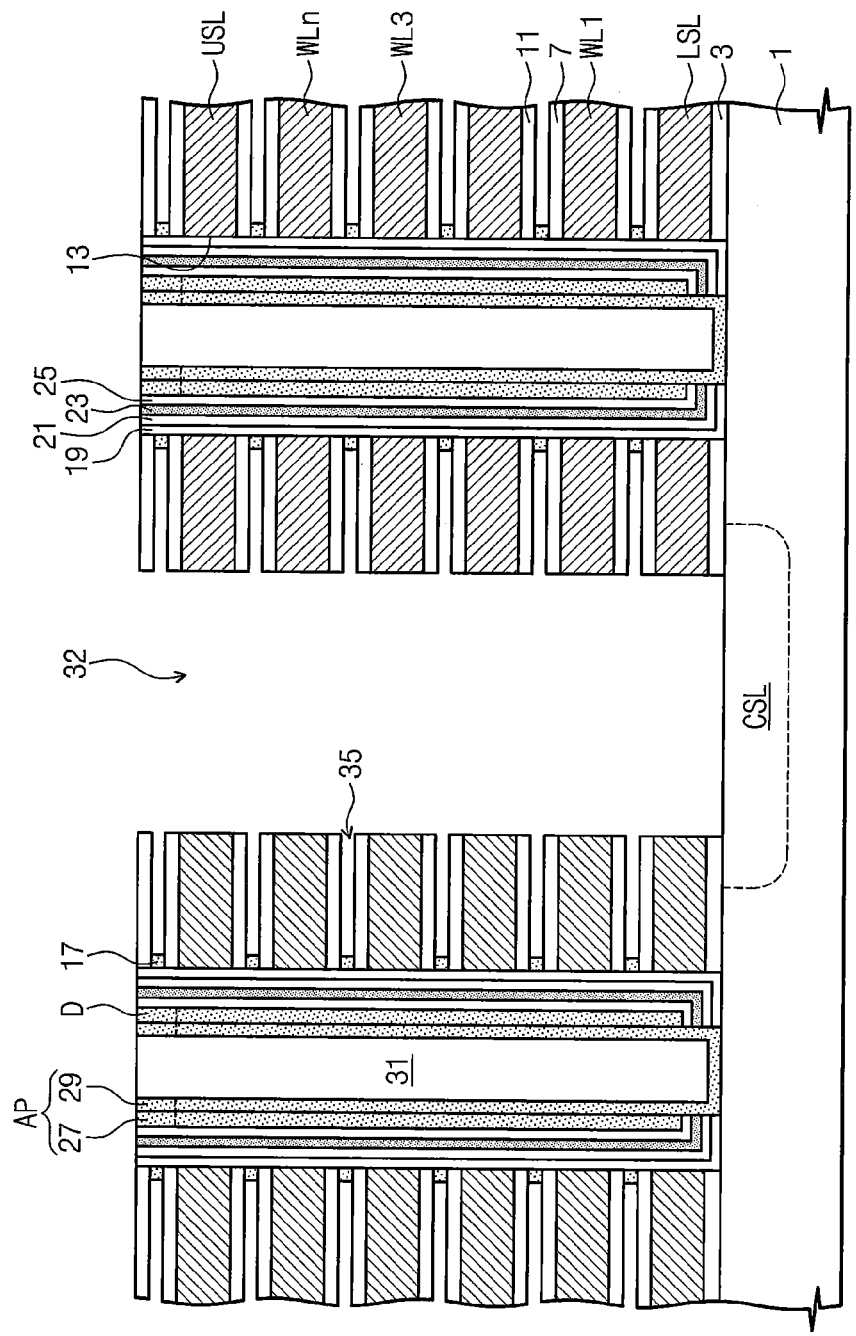

Referring now to FIG. 12, the second sacrificial layers 9 are selectively removed to expose the etch stop patterns 17. The etching process for removing the second sacrificial layers 9 may be suitably controlled by the etch stop patterns 17, and thus, it may be possible to reduce the likelihood, or possibly prevent, undesired portions from being damaged during the etching process. The second sacrificial layers 9 are removed to form third regions 35. The top and bottom surfaces of the first and second intergate insulating layers 7 and 11 may be exposed by the third region 35.

Figure 13:
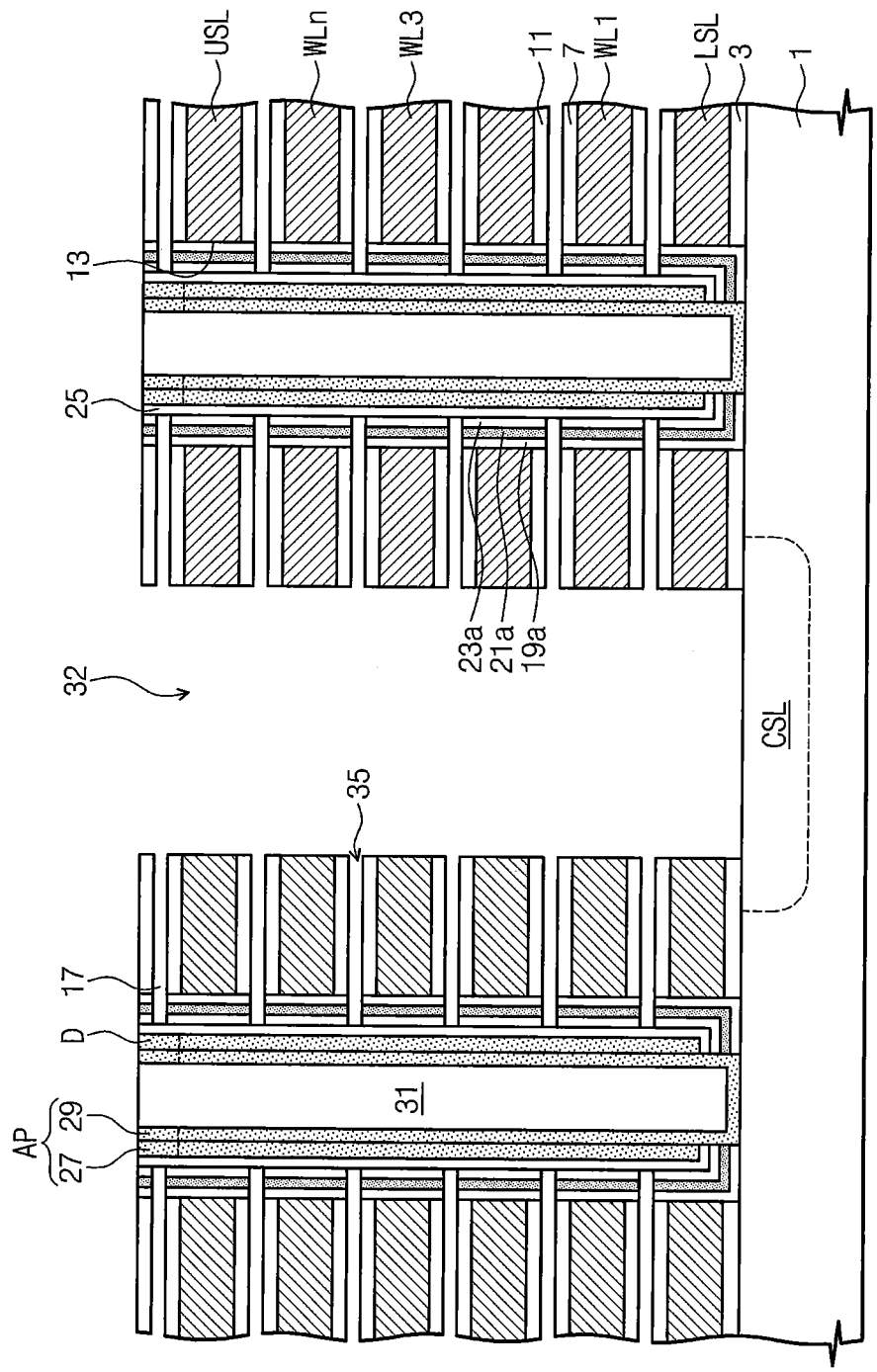

Referring now to FIG. 13, the etch stop patterns 17 are removed through the third regions 35 to expose the high-k dielectric layer 19. Subsequently, the high-k dielectric layer 19, the blocking dielectric layer 21, and the charge trap layer 23 may be sequentially and partially removed through the third regions 35 to form high-k dielectric patterns 19a, blocking dielectric patterns 21a, and charge trap patterns 23a. Thus, the charge trap patterns 23a coupled to the lines LSL, WL1 to WLn, and USL may be separated from each other.

Figure 14:
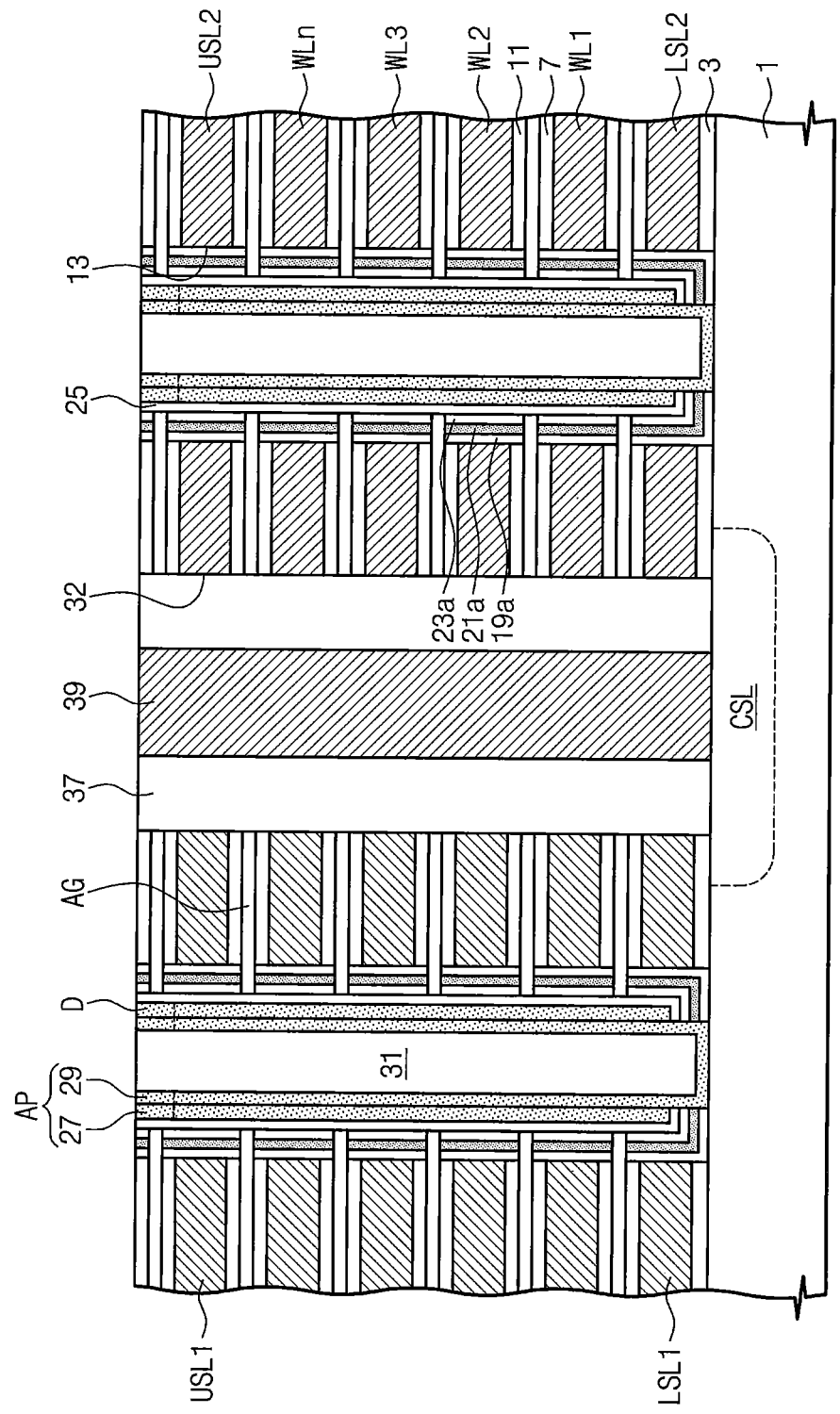

Referring now to FIG. 14, a second filling insulation layer may be conformally formed on the substrate 1, and an anisotropic etching process may be performed on the second filling insulation layer to form a second filling insulation pattern 37 covering sidewalls of the groove 32. When the second filling insulation layer is formed, the third regions 35 may be difficult to be filled with the second filling insulation layer because they may be relatively narrow. Thus, air gap regions AG are formed. A conductive layer may be formed on the entire top surface of the substrate 1, and the conductive layer may be planarized to form a common source interconnection 39 connected to the common source line CSL in the groove 32.

Subsequently, an upper interlayer insulating layer 41 may be formed on the upper selection line USL and the active pillar AP, as illustrated in FIG. 3. Next, bit line BL may be formed. The bit line BL may penetrate the upper interlayer insulating layer 41 so as to be electrically connected to the common drain region D.

Figure 15:
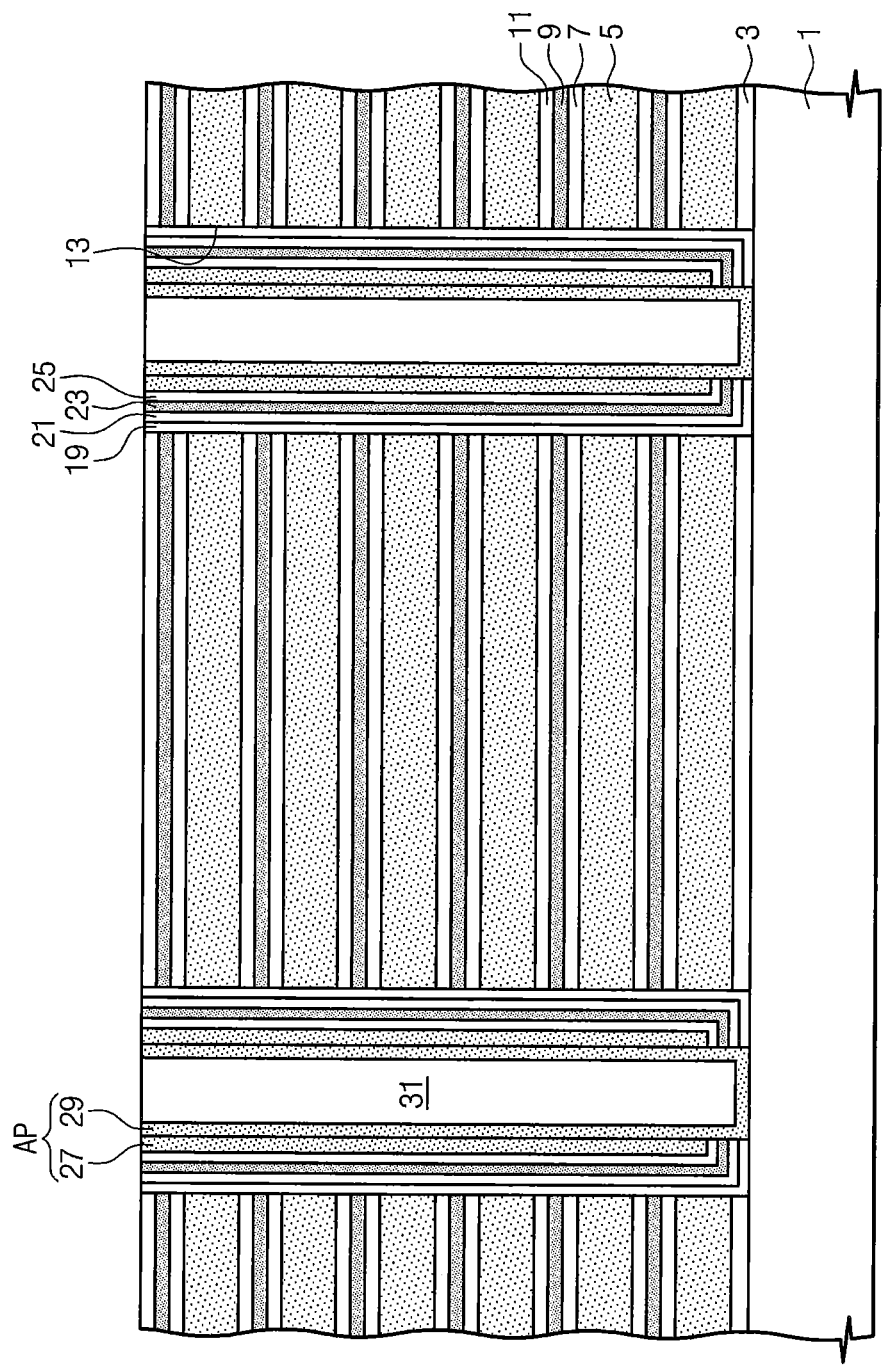
FIG. 15 is a cross-section illustrating processing steps in the fabrication of a semiconductor memory device according to some embodiments of the inventive concept.

Referring now to FIG. 15, a cross-section illustrating processing steps in the fabrication of semiconductor memory devices according to some embodiments of the inventive concept will be discussed. As illustrated in FIG. 15, the etch stop patterns 17 of FIG. 8 are not formed. In these embodiments, the processes discussed above with respect to FIGS. 6 and 7 may not be necessary and may be omitted. Other fabricating processes of embodiments illustrated in FIG. 15 may be the same as or similar to corresponding fabricating processes discussed above with respect to FIGS. 4-14.

Figure 16:
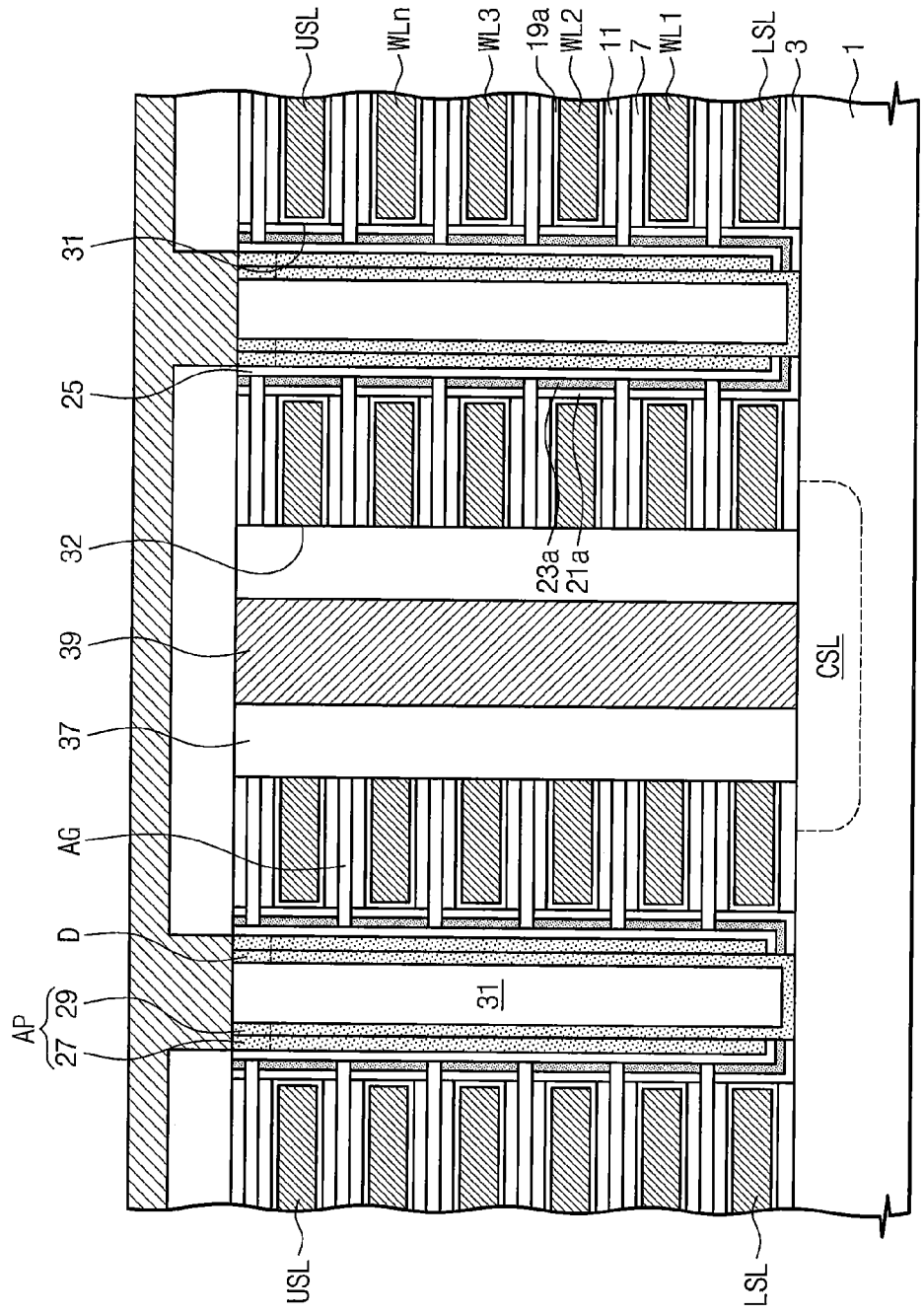
FIG. 16 is a cross-section illustrating a semiconductor memory device according to some embodiments of the inventive concept.
Figure 17:
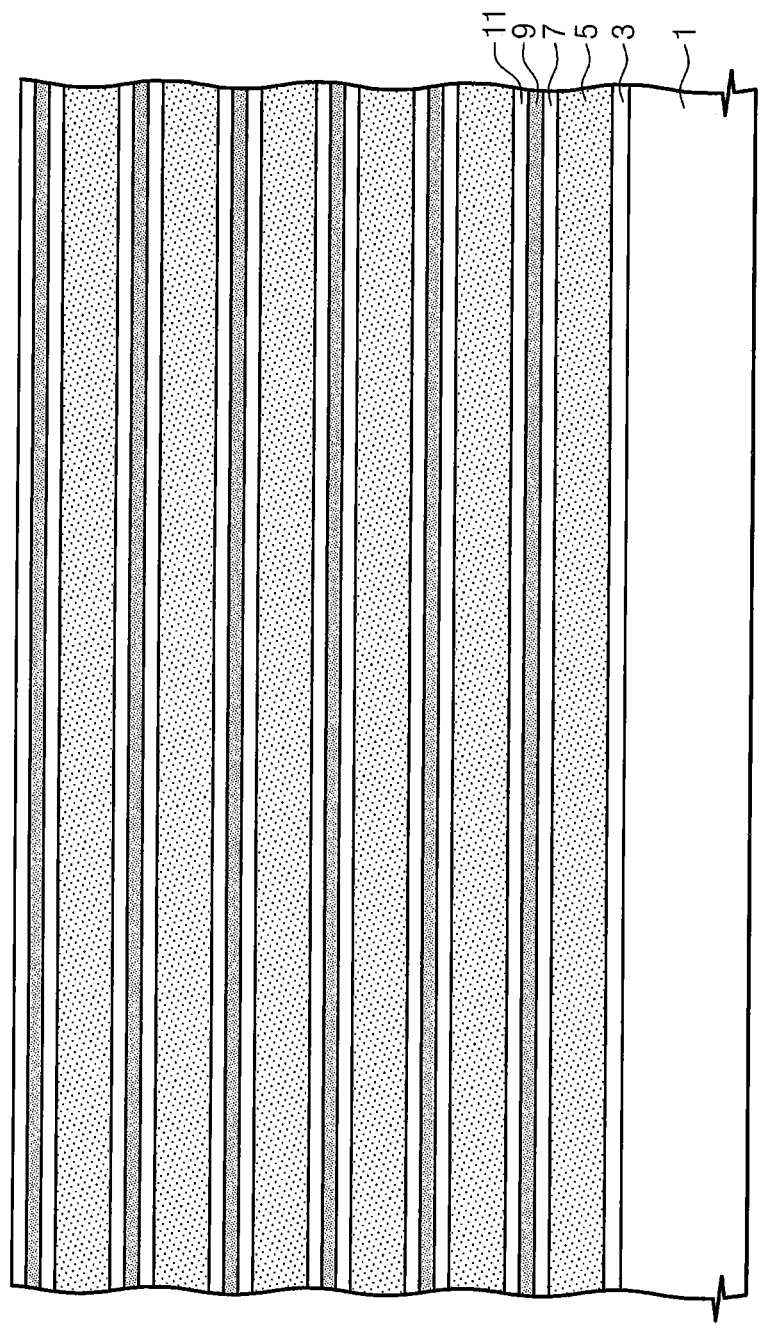
FIGS. 17 to 22 are cross-sections illustrating processing steps in the fabrication of the semiconductor memory device of FIG. 16 in accordance with some embodiments of the present inventive concept.

Referring now to FIG. 16, a cross-section illustrating a semiconductor memory device according to some embodiments of the inventive concept will be discussed. As illustrated in FIG. 16, a high-k dielectric pattern 19a may extend and be disposed between each of the lines LSL, WL1 to WLn, and USL and the intergate insulating layers 7 and 11 adjacent to each of the lines LSL, WL1 to WLn, and USL. Since the high-k dielectric pattern 19a surrounds each of the lines LSL, WL1 to WLn, and USL, a back tunneling phenomenon may be reduced, or possibly minimized, and a coupling ratio may be improved. Thus, an erase characteristic of the semiconductor memory device may be improved. Other elements of the semiconductor memory device according to some embodiments of the present inventive concept may be the same as or similar to corresponding elements of the semiconductor memory device discussed above with respect to FIG. 3.

Referring now to FIGS. 17 to 22, cross-sections illustrating processing steps in the fabrication of the semiconductor memory device of FIG. 16 will be discussed. Beginning with FIG. 17, a buffer oxide layer 3 may be formed on a substrate 1. Mold layers may be sequentially formed on the buffer oxide layer. Each of the mold layers includes a first sacrificial layer 5, a first intergate insulating layer 7, a second sacrificial layer 9, and a second intergate insulating layer 11 which are sequentially stacked. The sacrificial layers 5 and 9 are formed of materials of which etch rates are different from those of the intergate insulating layers 7 and 11. For example, the intergate insulating layers 7 and 11 may be formed of silicon oxide layers. The first sacrificial layer 5 may be formed of a different material from the second sacrificial layer 9. In some embodiments, the first sacrificial layer 5 may be formed of a silicon nitride layer, and a second sacrificial layer 9 may be formed of a poly-silicon layer.

Figure 18:
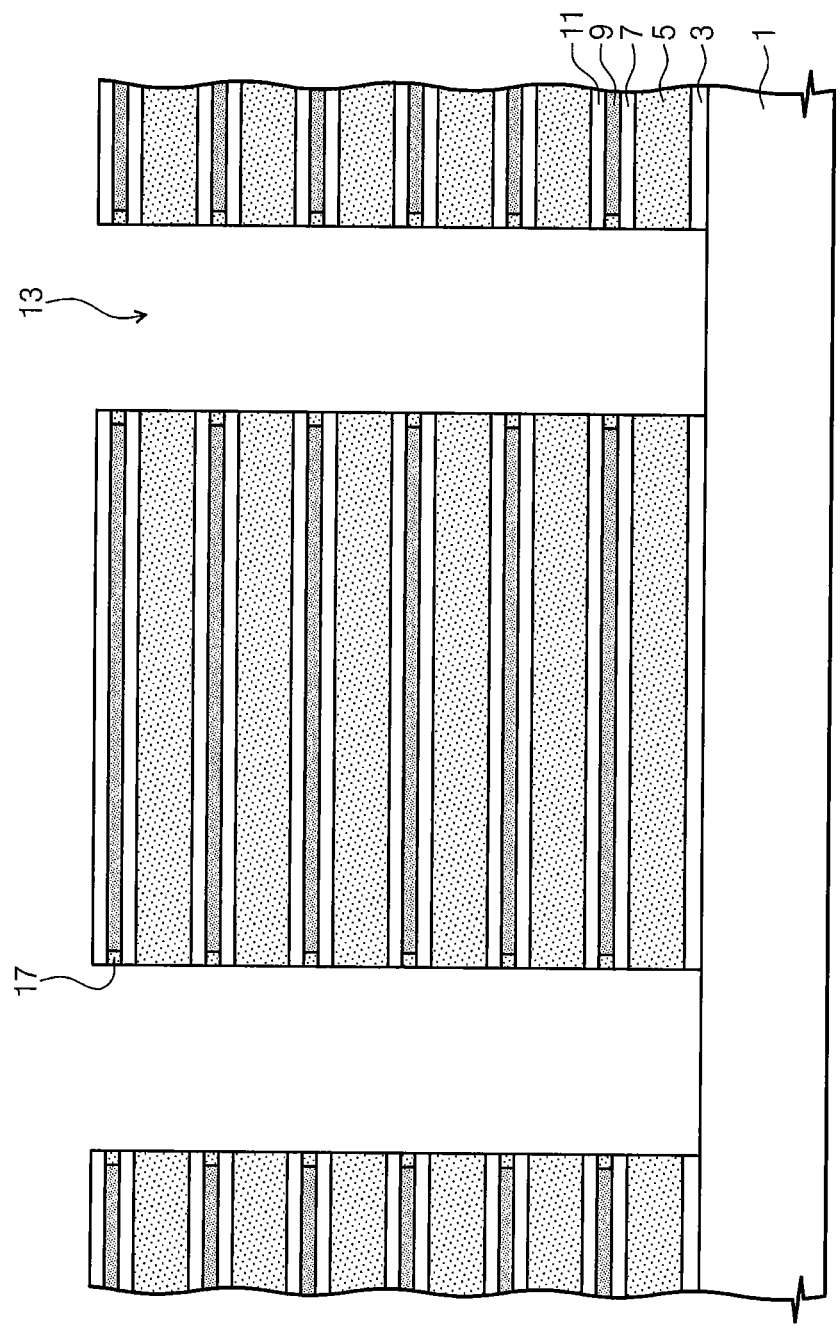

Referring now to FIG. 18, the mold layers, i.e., the second intergate insulating layers 11, the second sacrificial layers 9, the first intergate insulating layers 7, and the first sacrificial layers 5, and the buffer oxide layer 3 may be patterned to form active holes 13 exposing the substrate 1. Portions of the second sacrificial layers 9 exposed through the active hole 13 may be removed. Etch stop patterns 17 may be formed in regions formed by the removal of the portions of the second sacrificial layers 9. The etch stop pattern 17 may be formed of, for example, the same silicon nitride layer as the first sacrificial layer 5.

Figure 19:
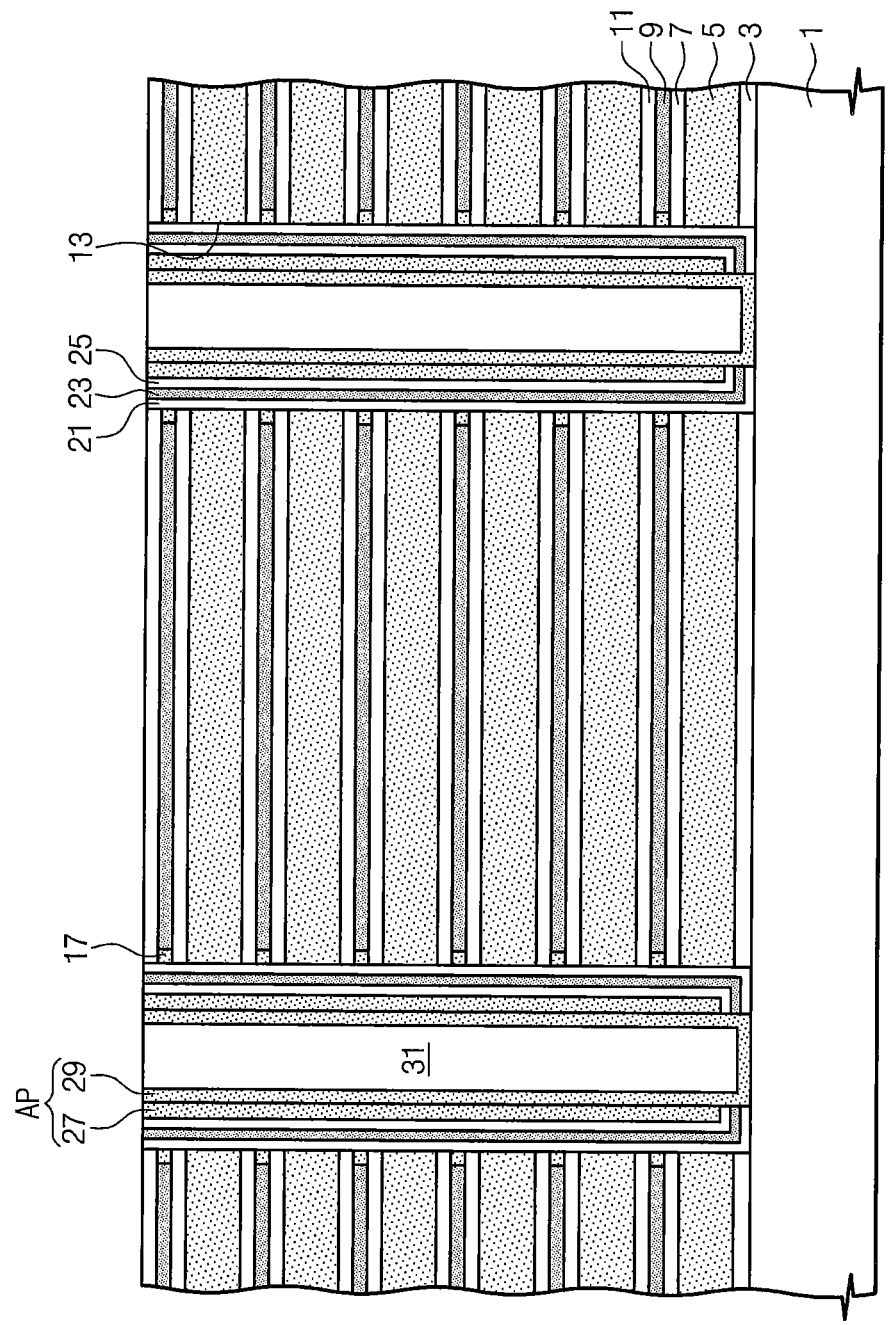

Referring now to FIG. 19, a blocking dielectric layer 21, a charge trap layer 23, a tunnel dielectric layer 25, and a first active layer 27 may be sequentially and conformally formed on an entire top surface of the substrate 1 having the active holes 13, and the layers 27, 25, 23, and 21 may be anisotropically etched to expose the substrate 1 under the active holes 13. Next, a second active layer 29 may be conformally formed on the entire top surface of the substrate 1, and a first filling insulation layer may be formed on the second active layer 29 to fill the active holes 13. A planarization etching process may be performed on the first filling insulation layer and the second active layer 29 to form an active pillar AP and a first filling insulation pattern 31 in each of the active holes 13. The active pillar AP may consist of the first and second active layers 27 and 29.

Figure 20:
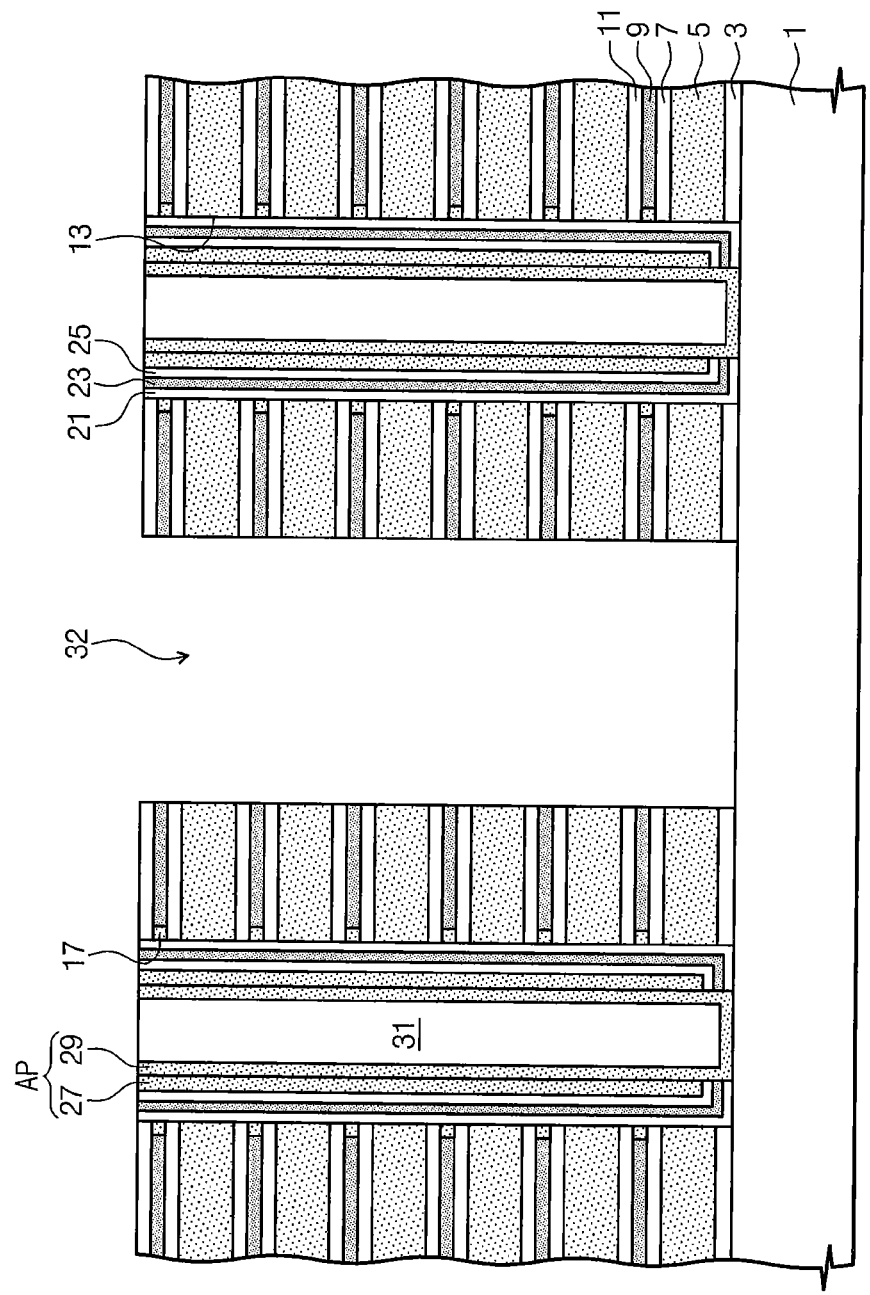

Referring now to FIG. 20, the mold layers, i.e., the second intergate insulating layers 11, the second sacrificial layers 9, the first intergate insulating layers 7, and the first sacrificial layers 5, and the buffer oxide layer 3 may be patterned at a position spaced apart from the active holes 13 to form a groove 32 exposing the substrate 1.

Figure 21:
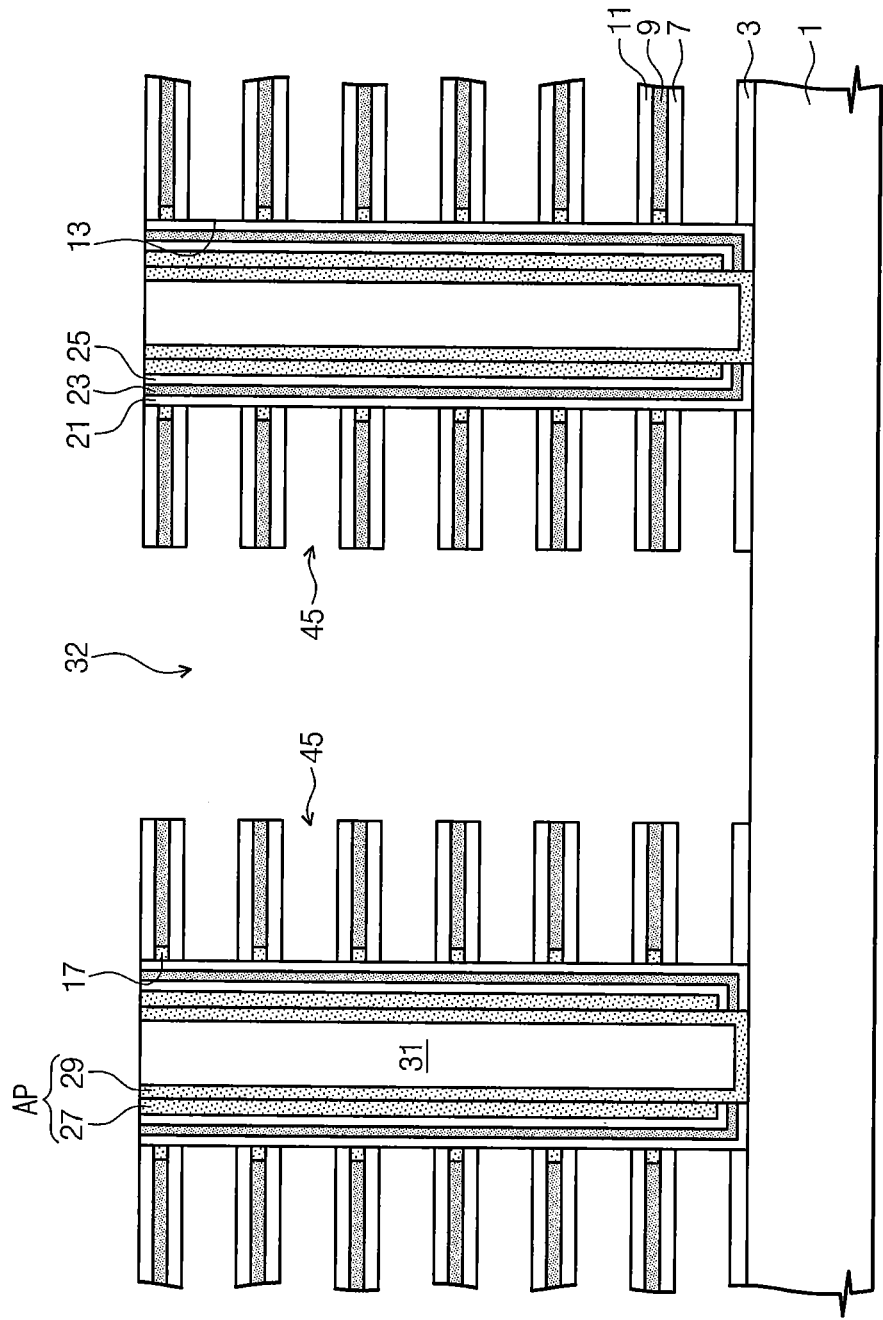

Referring now to FIG. 21, the first sacrificial layers 5 are removed to expose the blocking dielectric layer 21. Thus, top and bottom surfaces of the first and second intergate insulating layers 7 and 11 may be exposed through fourth regions 45 that are formed by the removal of the first sacrificial layers 5.

Figure 22:
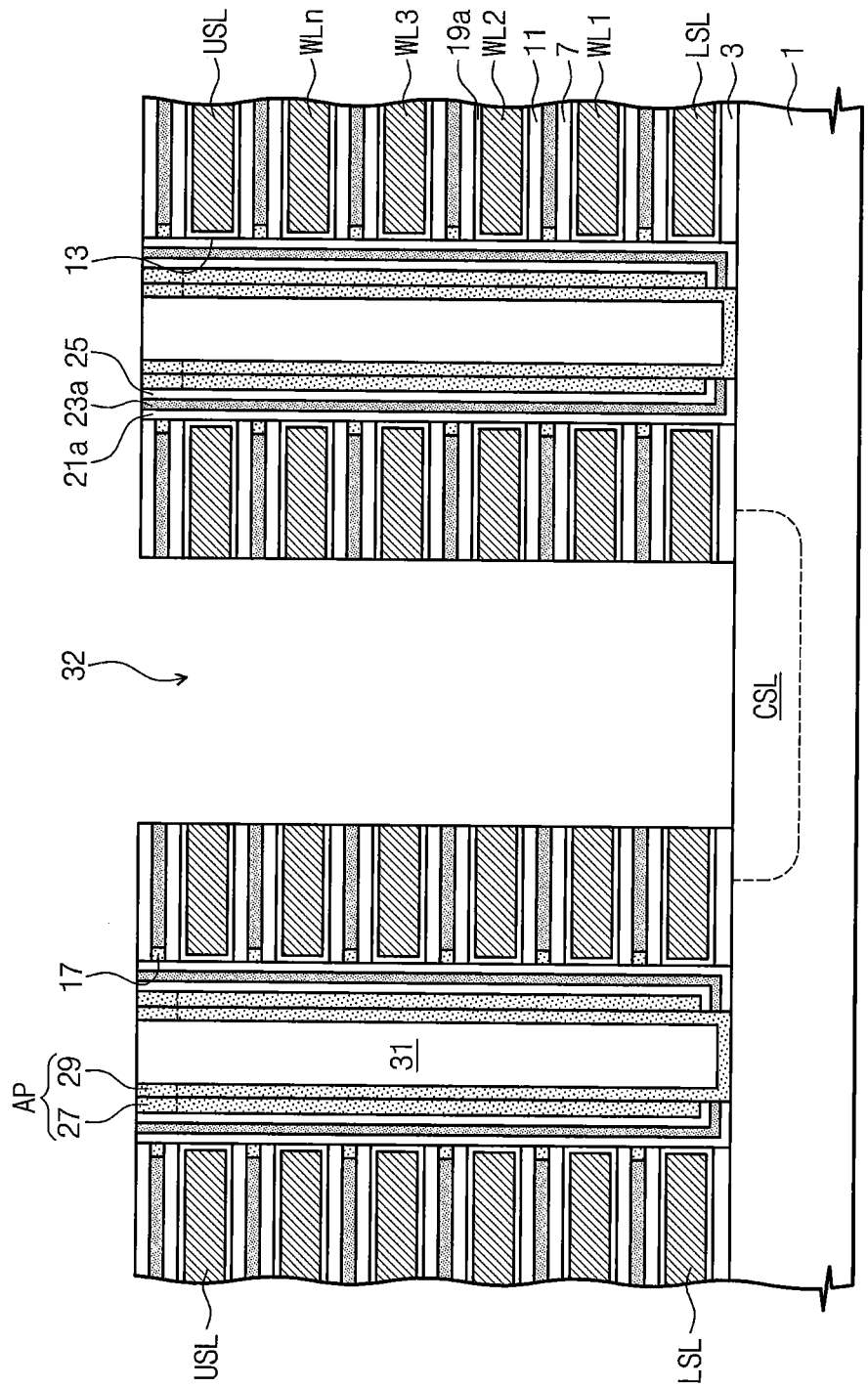

Referring now to FIG. 22, a high-k dielectric layer may be conformally formed on the entire top surface of the substrate 1, and a conductive layer may be formed on the high-k dielectric layer to fill the fourth regions 45. The high-k dielectric layer and the conductive layer disposed in the groove 32 may be removed to form high-k dielectric patterns 19a and conductive lines LSL, WL1 to WLn, and USL. Subsequent processes may be performed. The subsequent processes may be the same as or similar to corresponding processes discussed above with respect to FIGS. 3 and 14.

Figure 23:
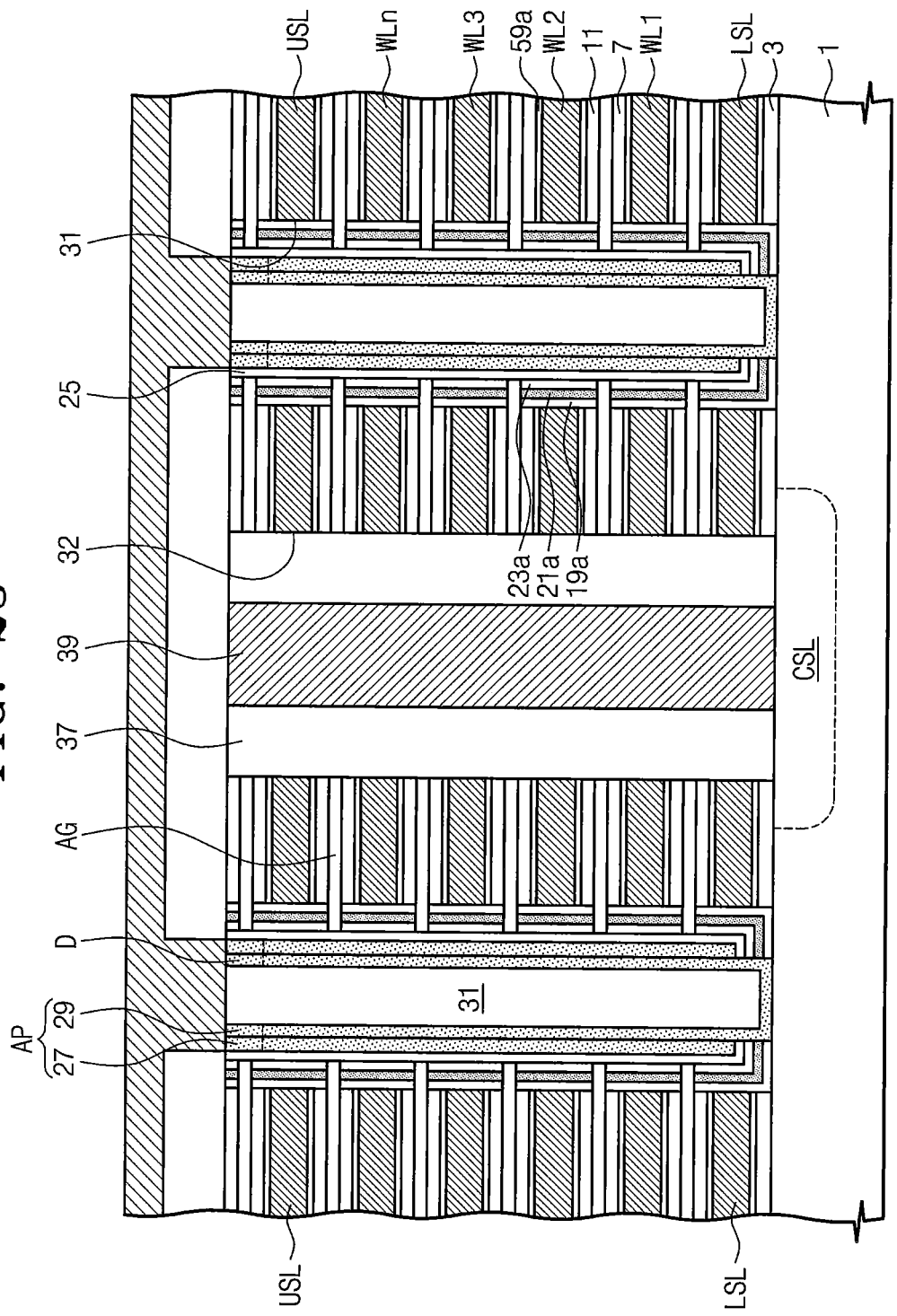
FIG. 23 is a cross-section illustrating a semiconductor memory device according to some embodiments of the inventive concept.

Referring now to FIG. 23, a cross-section illustrating a semiconductor memory device in accordance with some embodiments of the inventive concept will be discussed. As illustrated in FIG. 23, in a semiconductor memory device according to some embodiments, a first high-k dielectric pattern 59a may be disposed between each of the conductive lines LSL, WL1 to WLn, and USL and the intergate insulating layers 7 and 11 adjacent thereto. A second high-k dielectric pattern 19a may be disposed between each of the conductive lines LSL, WL1 to WLn, and USL and the blocking dielectric pattern 21a adjacent thereto. The second high-k dielectric pattern 19a may extend to be disposed between the blocking dielectric pattern 21a and the intergate insulating layers 7 and 11. Other elements of the semiconductor memory device of some embodiments may be the same as or similar to corresponding elements of the semiconductor memory device discussed above with respect to FIG. 3.

Figure 24:
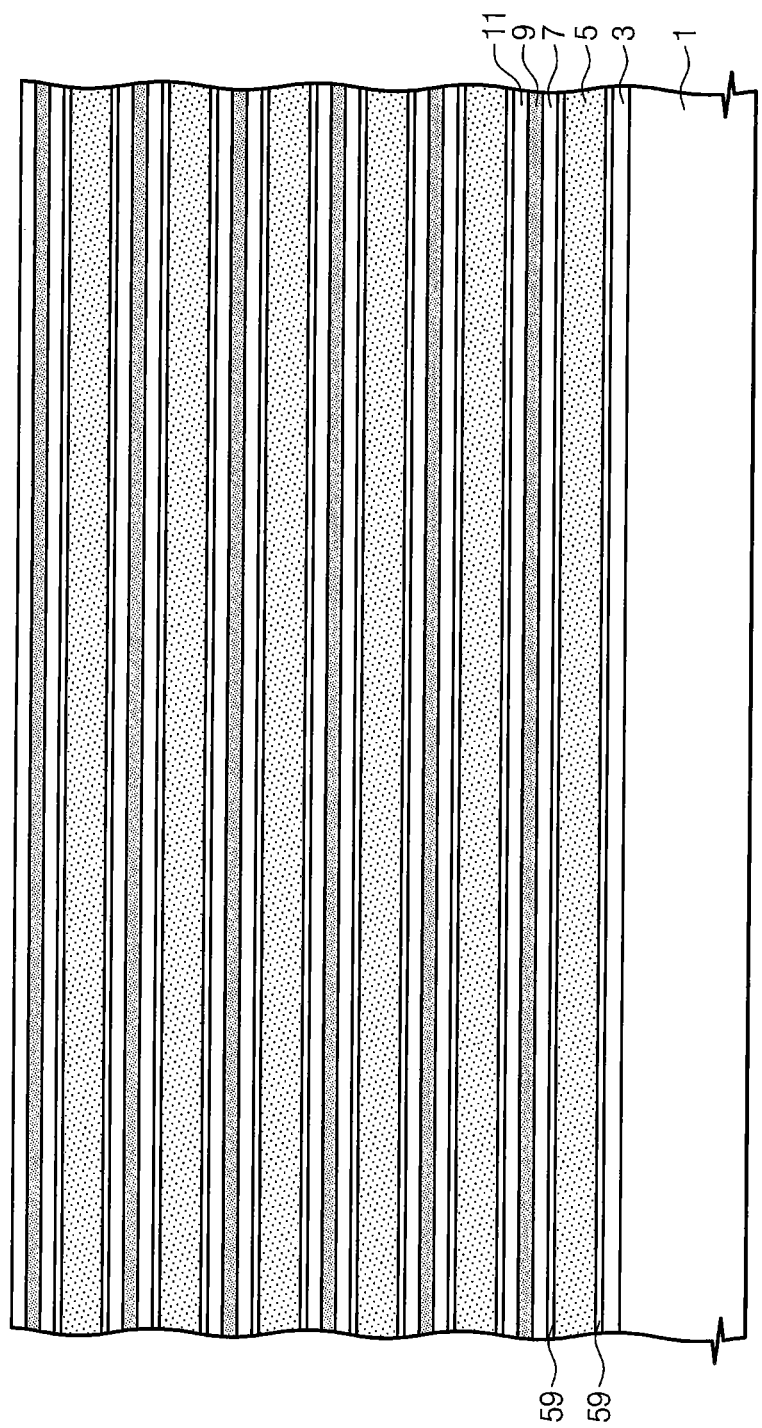
FIG. 24 is a cross-section illustrating processing steps in the fabrication of the semiconductor memory device of FIG. 23 in accordance with some embodiments of the present inventive concept.

Referring now to FIG. 24, a cross-section illustrating processing steps in the fabrication of the semiconductor memory device of FIG. 23 will be discussed. As illustrated in FIG. 24, a buffer oxide layer 3 may be formed on a substrate 1. Mold layers may be sequentially formed on the buffer oxide layer 3. Each of the mold layers includes a first sacrificial layer 5, a first intergate insulating layer 7, a second sacrificial layer 9, and a second intergate insulating layer 11 which are sequentially stacked. At this time, high-k dielectric layers 59 are formed to be in contact with top and bottom surfaces of each of the first sacrificial layers 5. Thereafter, subsequent processes may be performed. The subsequent processes may be the same as or similar to the processes discussed above with respect to FIGS. 4 to 14.

Figure 25:
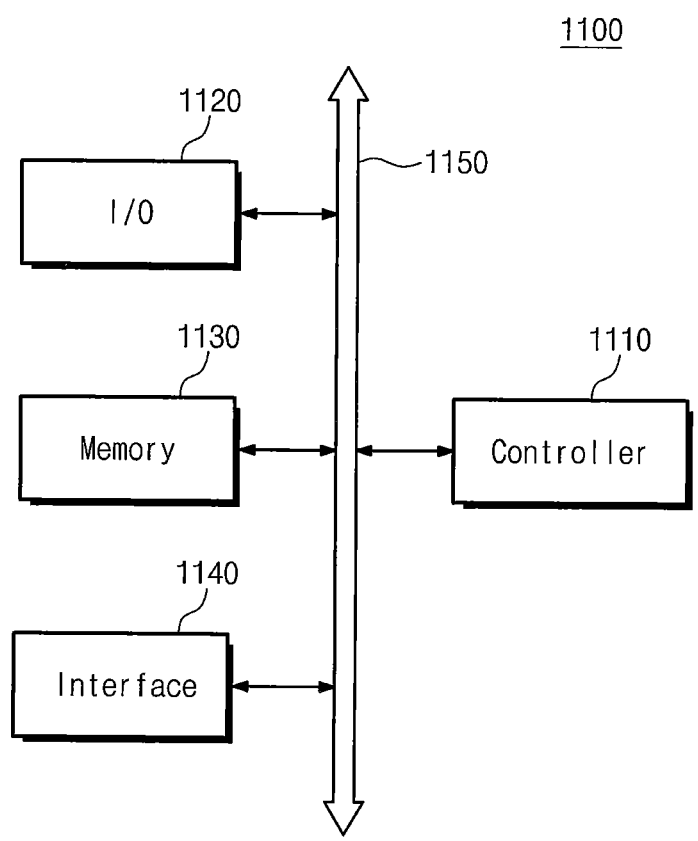
FIG. 25 is a schematic block diagram illustrating a memory system including a semiconductor memory device according to some embodiments of the inventive concept.

Referring now to FIG. 25, a schematic block diagram illustrating a memory system including a semiconductor memory device according to some embodiments of the inventive concept will be discussed. As illustrated in FIG. 25, a memory system 1100 may be used in a personal digital assistant (PDA), a portable computer, a web tablet, a wireless phone, a mobile phone, a digital music player, a memory card, or other electronic products receiving or transmitting information data by wireless.

The memory system 1100 may include a controller 4250, an input/output (I/O) unit 1120, a memory device 1130, an interface unit 1140, and a data bus 1150. At least two of the controller 4250, the I/O unit 1120, the memory device 1130, and the interface unit 1140 may communicate with each other through the data bus 1150.

The controller 4250 may include at least one of a microprocessor, a digital signal processor, a microcontroller, or other logic devices. Functions of the other logic devices may be similar to those of the microprocessor, the digital signal processor and the microcontroller. The memory device 1130 may store commands that are to be executed by the controller 4250. The I/O unit 1120 may receive data or signals from an external system or may output data or signals to the external system. For example, the I/O unit 1120 may include a keypad, a keyboard and/or a display device.

The memory device 1130 may include at least one of the semiconductor memory devices according to the aforementioned embodiments of the inventive concept. The memory device 1130 may further include at least one of another type of semiconductor memory devices and volatile random access memory devices.

The interface unit 1140 may transmit electrical data to a communication network or may receive electrical data from a communication network.

Figure 26:
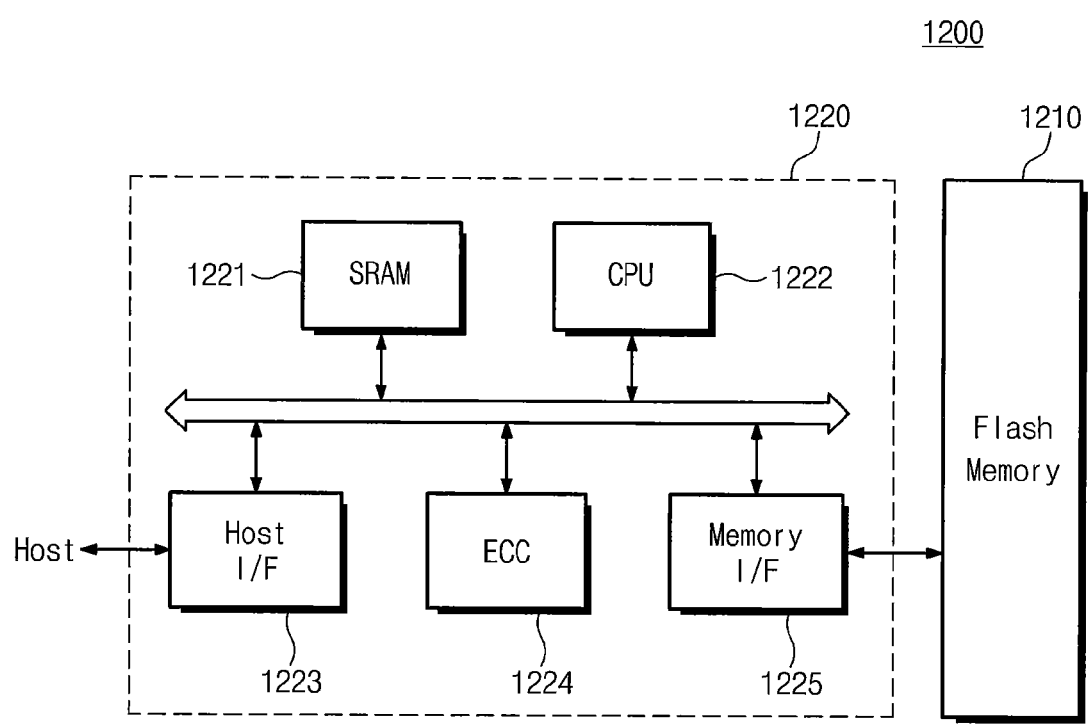
FIG. 26 is a schematic block diagram illustrating a memory card including a semiconductor memory device according to some embodiments of the inventive concept.

Referring now to FIG. 26, a schematic block diagram illustrating a memory card including a semiconductor memory device according to some embodiments of the inventive concept will be discussed. As illustrated in FIG. 26, a memory card 1200 for storing high-capacity data may include a flash memory device 1210 implemented with at least one of the semiconductor memory devices according to embodiments of the inventive concept. The memory card 1200 may further include a memory controller 1220 that controls data communication between a host and the flash memory device 1210.

A static random access memory (SRAM) device 1221 may be used as a working memory of a central processing unit (CPU) 1222. A host interface unit 1223 may be configured to include a data communication protocol between the memory card 1200 and the host. An error check and correction (ECC) block 1224 may detect and correct errors of data which are read out from the flash memory device 1210. A memory interface unit 1225 may interface with the flash memory device 1210. The CPU 1222 may control overall operations of the memory controller 1220 for exchanging data. Even though not shown in the drawings, the memory card 1200 may further include a read only memory (ROM) storing code data for interfacing with the host.

At least one of the semiconductor memory devices in the aforementioned embodiments may be used in a solid state disk (SSD).

Figure 27:
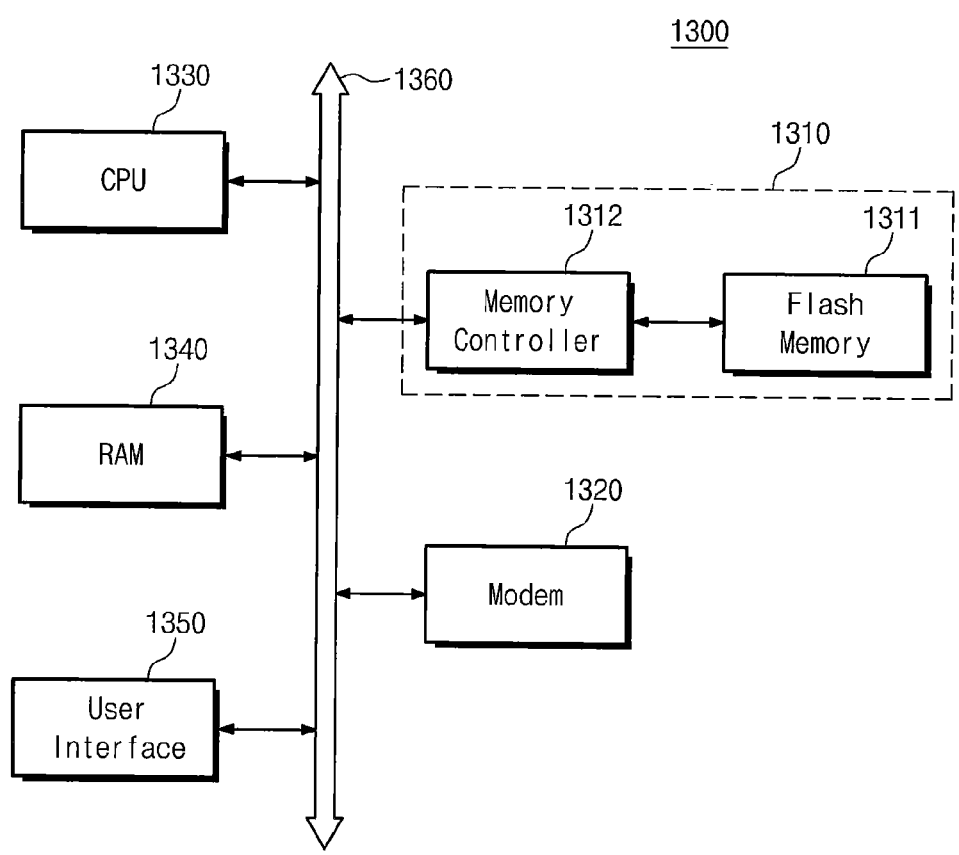
FIG. 27 is a schematic block diagram illustrating an information processing system including a semiconductor memory device according to some embodiments of the inventive concept.

Referring now to FIG. 27, a schematic block diagram illustrating an information processing system including a semiconductor memory device according to some embodiments of the inventive concept will be discussed. As illustrated in FIG. 27, an information processing system 1300, for example, a mobile device or a desk top computer, may include a flash memory system 1310 implemented with at least one of the semiconductor memory devices according to embodiments of the inventive concept. The information processing system 1300 may further include a modem 1320, a central processing unit (CPU) 1330, a random access memory (RAM) device 1340, and a user interface unit 1350 which are electrically connected to the flash memory system 1310 through a system bus 1360. The flash memory system 1310 may be a substantially same as the memory system or the memory card described above. The flash memory system 1310 may store data inputted from an external system and/or data processed by the CPU 1330. In some embodiments, the flash memory system 1310 may be realized as a solid state disk (SSD). In these embodiments, the information processing system 1330 may stably store massive data into the flash memory system. Furthermore, as reliability of the flash memory system 1310 increases, the flash memory system 1310 may reduce a resource consumed for correcting errors. Even though not shown in the drawings, an application chipset, a camera image processor (CIS), and an input/output unit may further be provided in the information processing system 1300.

The semiconductor memory devices and/or the memory system according to some embodiments of the inventive concept may be encapsulated using various packaging techniques. For example, the semiconductor memory devices and/or the memory system according to the aforementioned embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOP) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique and a wafer-level processed stack package (WSP) technique.

In the semiconductor memory devices according to some embodiments of the inventive concept, the air gap region exists between the gate electrodes, so the coupling effect between the gate electrodes may be reduced. In other words, the RC delay may be reduced and the signal transfer speed may be improved. In addition, the thicknesses of the intergate insulating layers can be reduced, so highly integrated semiconductor memory devices may be easily fabricated.

In the semiconductor memory device according to some embodiments of the inventive concept, the charge trap layers disposed between the active pillar and the gate electrodes may be separated from each other. Thus, it is possible to reduce the likelihood, or possibly prevent, charges from being transferred between the charge trap layers. This means that the operating errors of the semiconductor memory device and the coupling effect between the transistors of the cell string may be reduced or prevented.

In processing steps in the fabrication of semiconductor memory devices according to some embodiments of the inventive concept, the first sacrificial layer may be formed of the poly-silicon layer, and the silicidation process may be performed to convert the first sacrificial layer into the metal silicide layer. Thus, the processes of fabricating the semiconductor memory device may be simplified.

In processing steps in the fabrication of semiconductor memory devices according to some embodiments of the inventive concept, the portions of the second sacrificial layers may be replaced with the etch stop patterns immediately after the formation of the active hole. Thus, the damage of undesired portions may be minimized or prevented when the air gap regions are formed.

While the inventive concept has been described with reference to example embodiments, it will be apparent to those skilled in the art that various changes and modifications may be made without departing from the spirits and scopes of the inventive concept. Therefore, it should be understood that the above embodiments are not limiting, but illustrative. Thus, the scope of the inventive concept are to be determined by the broadest permissible interpretation of the following claims and their equivalents, and shall not be restricted or limited by the foregoing description.

What is claimed is:

1. A semiconductor memory device comprising:
   an active pillar protruding from a substrate;
   a first gate electrode and a second gate electrode adjacent to a sidewall of the active pillar and vertically overlapping with each other, wherein the first and second gate electrodes are insulated from each other;
   a first intergate insulating layer on a first surface of the first gate electrode;
   a second intergate insulating layer covering a second surface, opposite the first surface, of the second gate electrode and spaced apart from the first intergate insulating layer,
   wherein the first intergate insulating layer and the second intergate insulating layer define an air gap therebetween;
   a first charge trap layer between the active pillar and the first gate electrode;
   a second charge trap layer between the active pillar and the second gate electrode, the second charge trap layer being spaced apart from the first charge trap layer;
   a first blocking dielectric layer between the first charge trap layer and the first gate electrode; and
   a second blocking dielectric layer between the second charge trap layer and the second gate electrode, the second blocking dielectric layer being spaced apart from the first blocking dielectric layer.

2. The semiconductor memory device of claim 1, wherein the air gap region is between the first charge trap layer and the second charge trap layer and separates the first and second charge trap layers from each other.

3. The semiconductor memory device of claim 1, wherein the first blocking dielectric layer and the first charge trap layer are between the first intergate insulating layer and the active pillar, and
   wherein the second blocking dielectric layer and the second charge trap layer are between the second intergate insulating layer and the active pillar.

4. The semiconductor memory device of claim 1, further comprising:
   a first high-k dielectric layer between the first blocking dielectric layer and the first gate electrode; and
   a second high-k dielectric layer disposed the second blocking dielectric layer and the second gate electrode, the second high-k dielectric layer spaced apart from the first high-k dielectric layer.

5. The semiconductor memory device of claim 4, wherein the first high-k dielectric layer extends between the first gate electrode and the first intergate insulating layer, and
   wherein the second high-k dielectric layer extends between the second gate electrode and the second intergate insulating layer.

6. A semiconductor memory device comprising:
   an active pillar protruding from a substrate;
   a first gate electrode and a second gate electrode adjacent to a sidewall of the active pillar and vertically overlapping with each other, wherein the first and second gate electrodes are insulated from each other;
   a first intergate insulating layer on a top surface of the first gate electrode;
   a second intergate insulating layer covering a bottom surface of the second gate electrode and spaced apart from the first intergate insulating layer;
   a first charge trap layer on an inner side surface, opposite the active pillar, of the first gate electrode and between the active pillar and the first gate electrode;
   a second charge trap layer on an inner side surface, opposite the active pillar, of the second gate electrode and between the active pillar and the second gate electrode, the second charge trap layer being spaced apart from the first charge trap layer;

a first blocking dielectric layer on the inner side surface of the first gate electrode and between the first charge trap layer and the first gate electrode; and a second blocking dielectric layer on the inner side surface of the second gate electrode and between the second charge trap layer and the second gate electrode, the second blocking dielectric layer being spaced apart from the first blocking dielectric layer, wherein the first and second charge trap layers are spaced apart from the first and second intergate insulating layers, respectively.

7. The semiconductor memory device of claim 6, wherein the first and second charge trap layers do not vertically overlap with the first and second gate electrodes, respectively.

8. The semiconductor memory device of claim 6, wherein the first and second blocking dielectric layers do not vertically overlap with the first and second gate electrodes, respectively.

9. A method of fabricating a semiconductor memory device, the method comprising:

sequentially forming mold layers on a substrate, each of the mold layers comprising a first sacrificial layer, a first intergate insulating layer, a second sacrificial layer, and a second intergate insulating layer which are sequentially stacked;

patterning the second intergate insulating layers, the second sacrificial layers, the first intergate insulating layers, and the first sacrificial layers to define an active hole exposing at least a portion of the substrate;

forming a blocking dielectric layer, a charge trap layer, a tunnel dielectric layer, and an active pillar sequentially on a sidewall of the active hole;

patterning the second intergate insulating layers, the second sacrificial layers, the first intergate insulating layers, and the first sacrificial layers to define a groove exposing at least a portion of the substrate, the groove being spaced apart from the active hole;

replacing the first sacrificial layers with conductive layers through the groove; and removing the second sacrificial layers to define air gap regions.

10. The method of claim 9, further comprising replacing portions of the second sacrificial layers exposed by the active hole with etch stop patterns before forming the blocking dielectric layer.

11. The method of claim 10, wherein replacing the portions of the second sacrificial layers exposed by the active hole with the etch stop patterns comprises:

removing the portions of the second sacrificial layers exposed by the active hole; and forming the etch stop patterns in regions that are formed by removing the portions of the second sacrificial layers.

12. The method of claim 9, further comprising:

partially removing the blocking dielectric layer and the charge trap layer adjacent to the second sacrificial layers after removing the second sacrificial layers, wherein the air gap regions expose the tunnel dielectric layer.

13. The method of claim 12, further comprising:

forming a first high-k dielectric layer on the sidewall of the active hole before forming the blocking dielectric layer; and partially removing the first high-k dielectric layer adjacent to the second sacrificial layers after removing the second sacrificial layers.

14. The method of claim 13, wherein each of the mold layers further comprises:

second high-k dielectric layers formed on first and second opposite surfaces of the first sacrificial layer, respectively, wherein the second high-k dielectric layers are formed before the active hole is formed.

15. The method of claim 9, further comprising:

forming a filling insulation layer on sidewalls of the groove; and forming a conductive interconnection in the groove, the conductive interconnection being in contact with the substrate and a sidewall of the filling insulation layer.

16. The method of claim 9:

wherein the first sacrificial layers are formed of poly-silicon layers; and wherein replacing the first sacrificial layers with the conductive layers comprises performing a silicidation process to convert the first sacrificial layers into metal silicide layers.

17. The method of claim 16, further comprising partially removing the first sacrificial layers exposed through the groove to at least partially expose bottom surfaces of the first intergate insulating layers and surfaces of the second intergate insulating layers before performing the silicidation process.

18. The method of claim 9, wherein replacing the first sacrificial layers with the conductive layers comprises:

removing the first sacrificial layers to define empty regions exposing first surfaces of the first intergate insulating layers, surfaces of the second intergate insulating layers, and the blocking dielectric layer;

conformally forming a high-k dielectric layer in the empty regions;

forming a conductive layer filling the empty regions; and removing the conductive layer disposed in the groove.

* * * * *